United States Patent
Kitajo et al.

(10) Patent No.: US 9,711,461 B2
(45) Date of Patent: Jul. 18, 2017

(54) WIRING SUBSTRATE AND SEMICONDUCTOR DEVICE

(71) Applicant: SHINKO ELECTRIC INDUSTRIES CO., LTD., Nagano-Ken (JP)

(72) Inventors: Natsuko Kitajo, Nagano (JP); Yuji Yukiiri, Nagano (JP); Izumi Tanaka, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 15/298,487

(22) Filed: Oct. 20, 2016

(65) Prior Publication Data

US 2017/0141044 A1    May 18, 2017

(30) Foreign Application Priority Data

Nov. 17, 2015   (JP) ................. 2015-224688

(51) Int. Cl.
| | |
|---|---|
| H01L 23/04 | (2006.01) |
| H01L 21/44 | (2006.01) |
| H01L 23/544 | (2006.01) |
| H01L 23/498 | (2006.01) |

(52) U.S. Cl.
CPC ...... *H01L 23/544* (2013.01); *H01L 23/49827* (2013.01)

(58) Field of Classification Search
CPC .................................................. H01L 23/544
USPC .................. 257/621, 698, 774; 438/666, 667
See application file for complete search history.

(56) References Cited

U.S. PATENT DOCUMENTS

2015/0092357 A1* 4/2015 Yoshikawa ............. H01L 25/00
                                                          361/746

FOREIGN PATENT DOCUMENTS

| JP | 2005-252155 A | 9/2005 |
| JP | 2009-194321 A | 8/2009 |

* cited by examiner

*Primary Examiner* — Calvin Lee
(74) *Attorney, Agent, or Firm* — Tarolli, Sundheim, Covell & Tummino LLP

(57) ABSTRACT

A wiring substrate includes first through holes extending through an insulation layer, first via wirings formed in the first through holes, a conductive pattern connected to the first via wirings, recesses formed in the first via wirings, and a protective insulation layer covering the conductive pattern and the first via wirings. The first via wirings, the conductive pattern, the recesses, and the protective insulation layer form an identification mark identifiable as a particular shape including a character or a symbol. Each recess is defined by an upper surface of the corresponding first via wiring and includes a curved side wall and a bottom wall that is located at a lower position than an upper surface of the conductive pattern. The protective insulation layer is thicker over the first via wirings than over the conductive pattern.

8 Claims, 15 Drawing Sheets

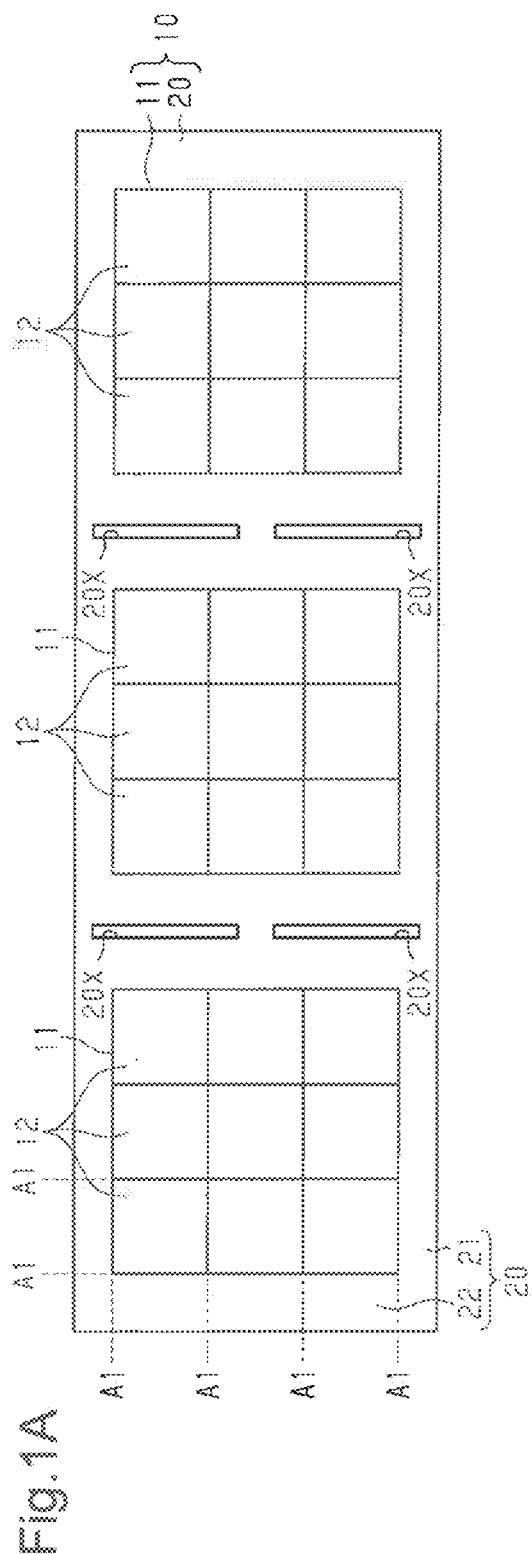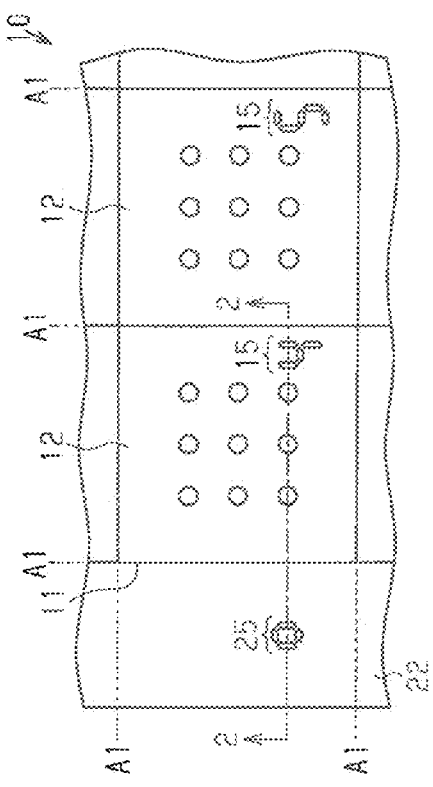

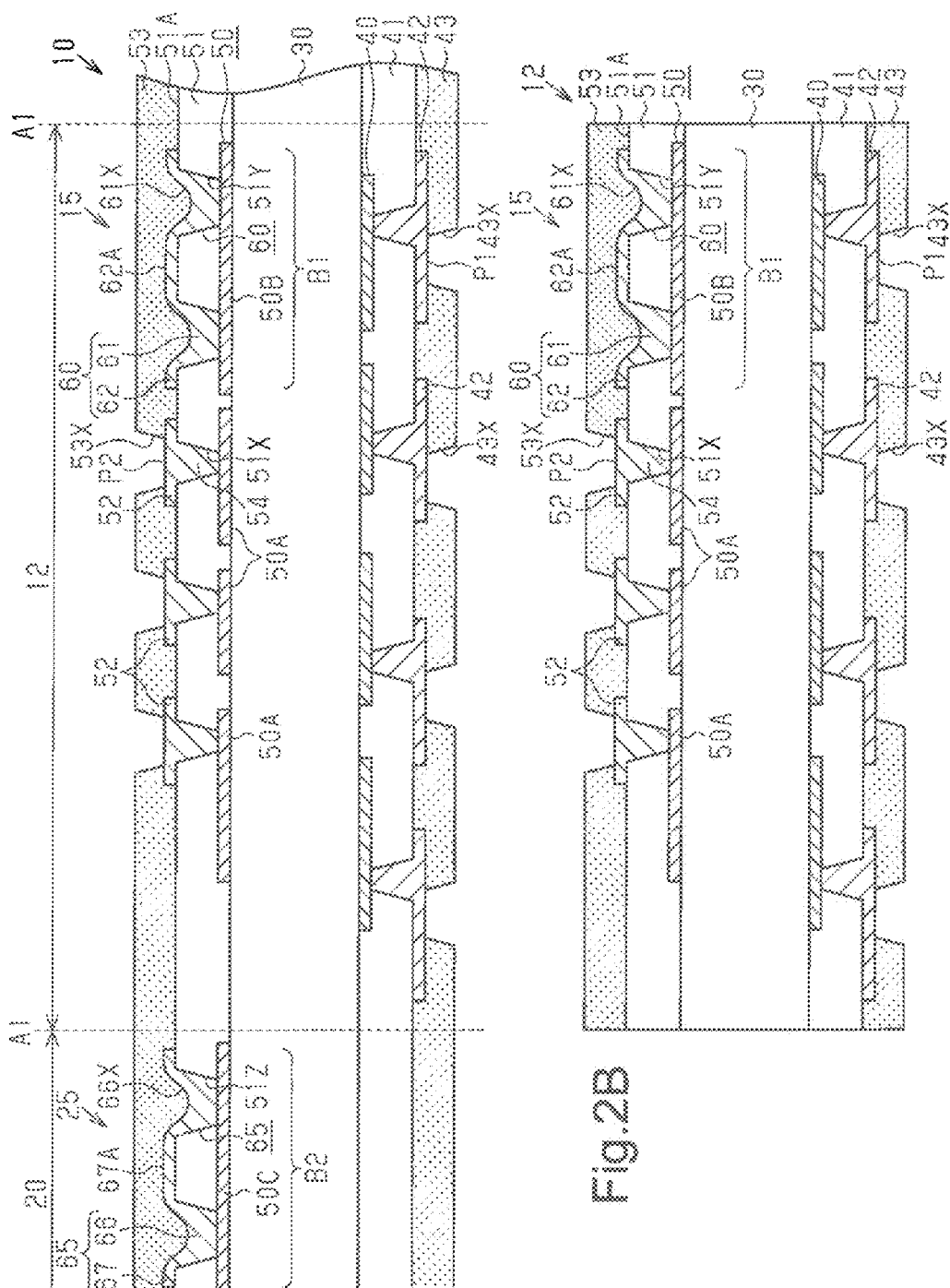

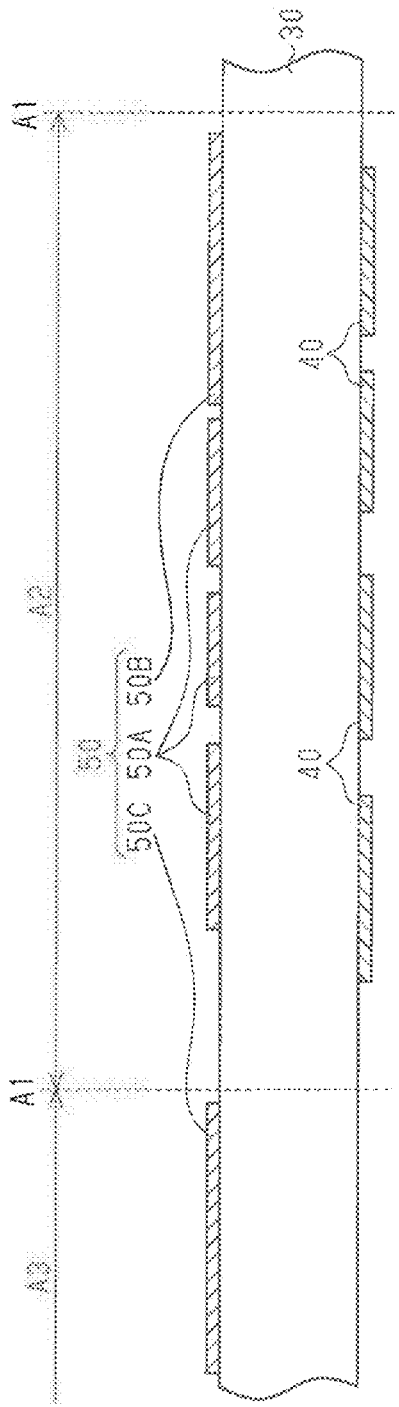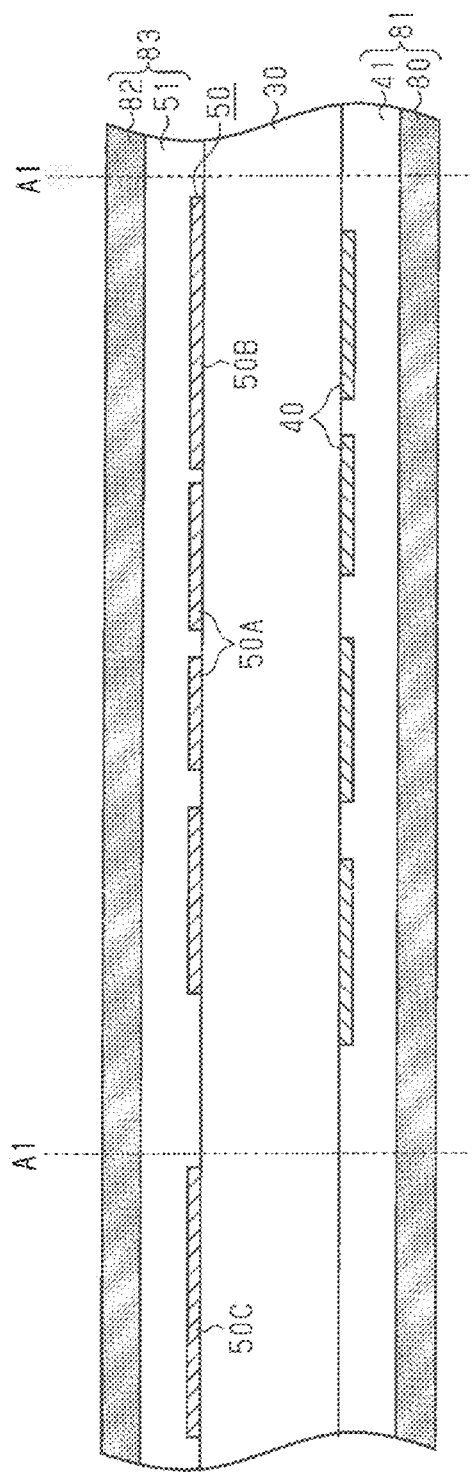

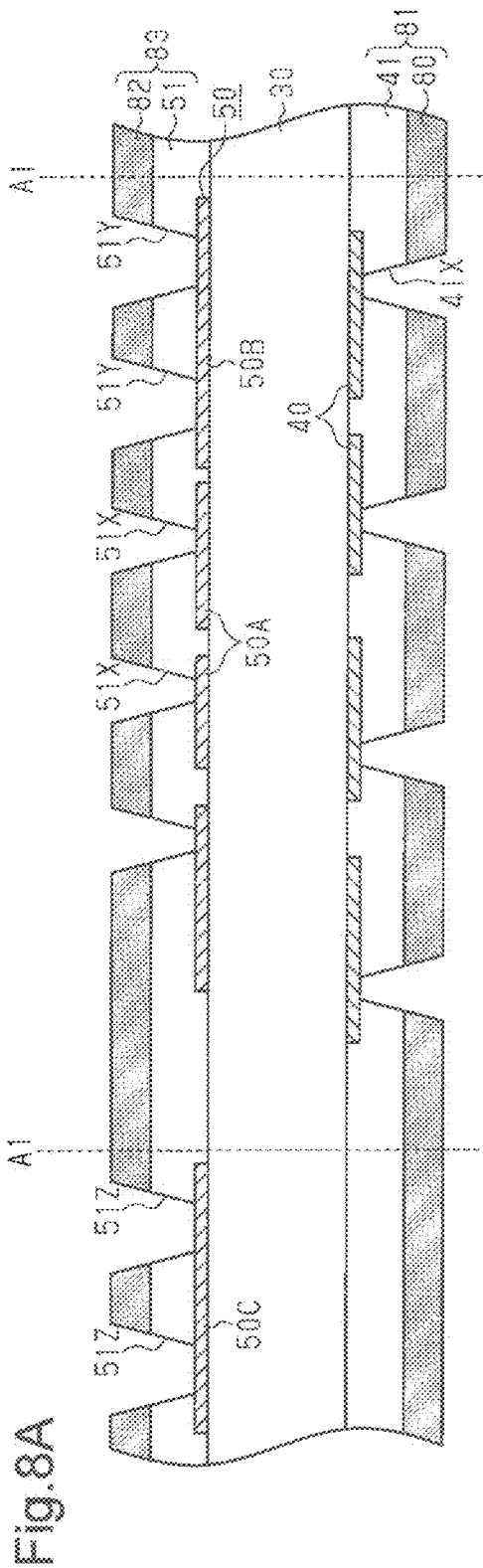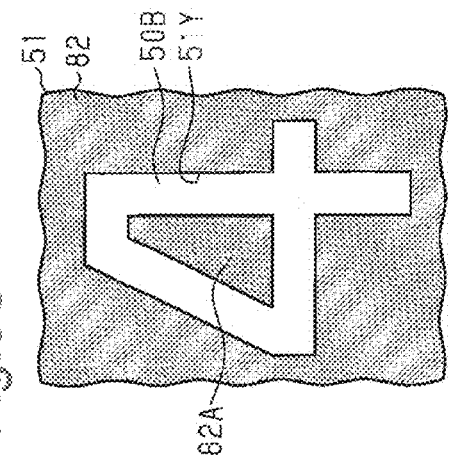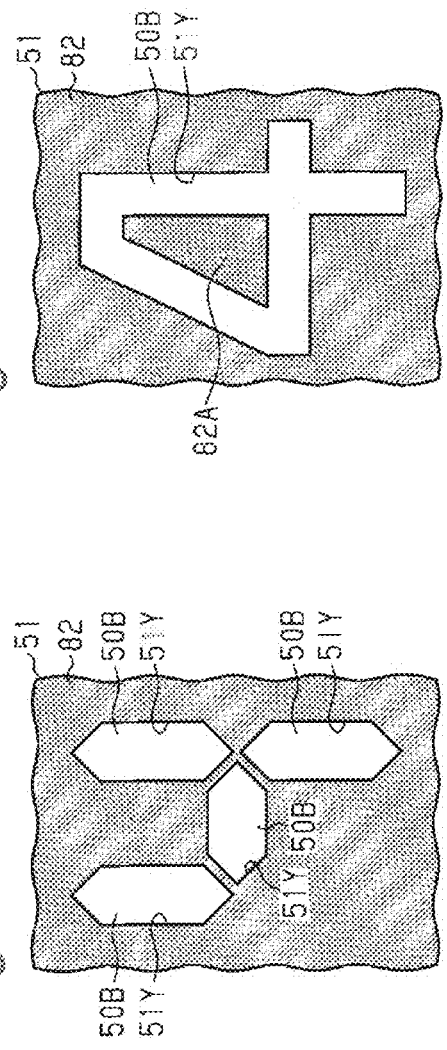

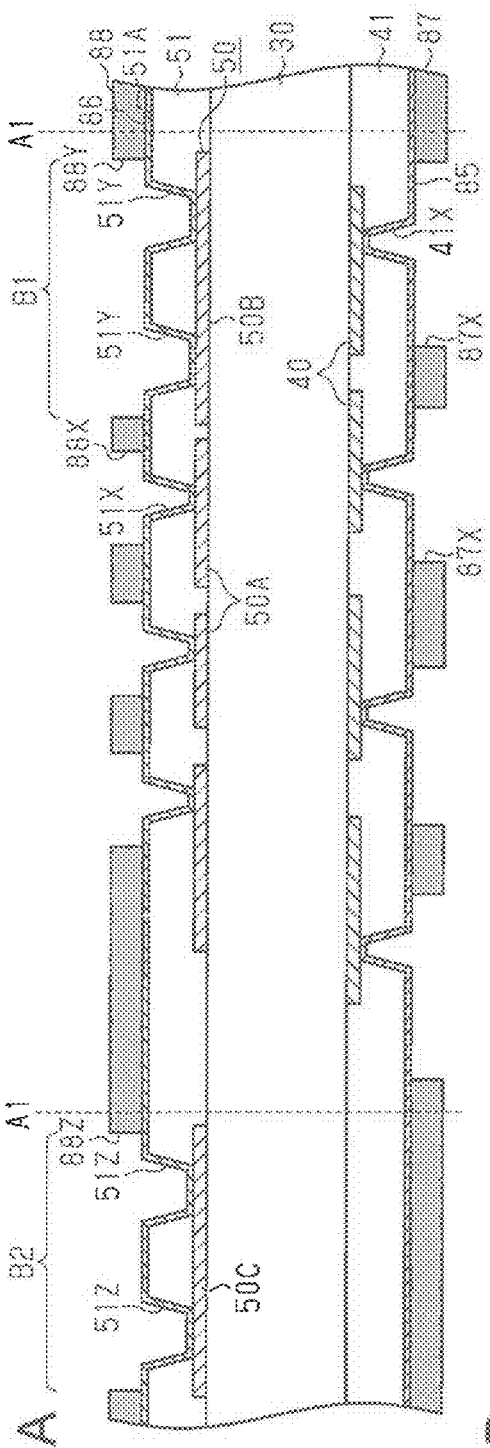
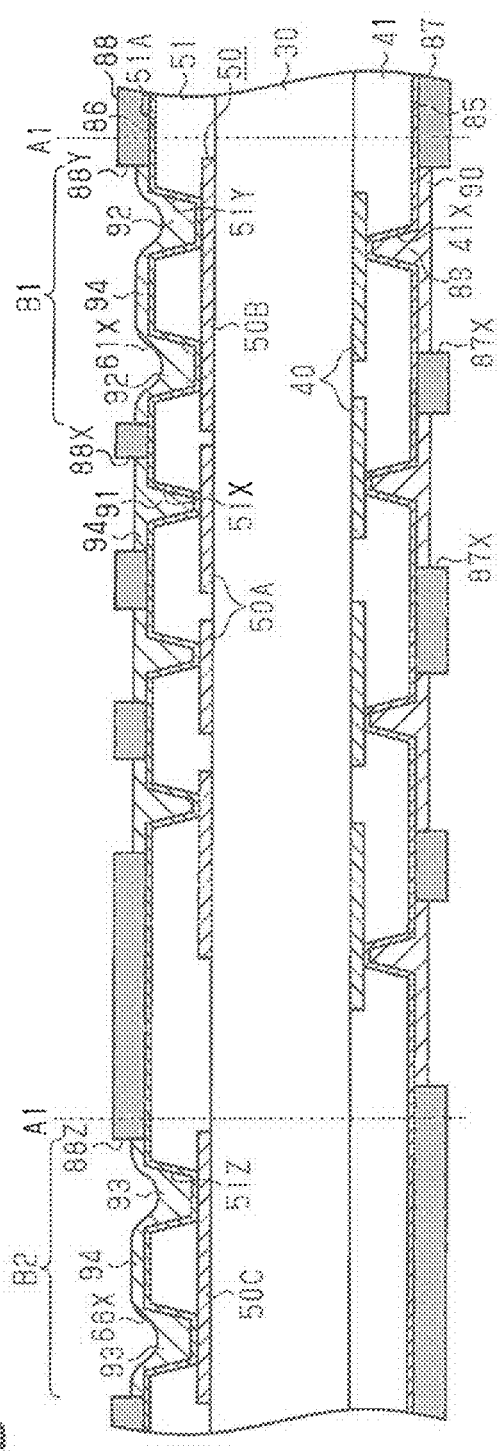
Fig.10A
Fig.10B

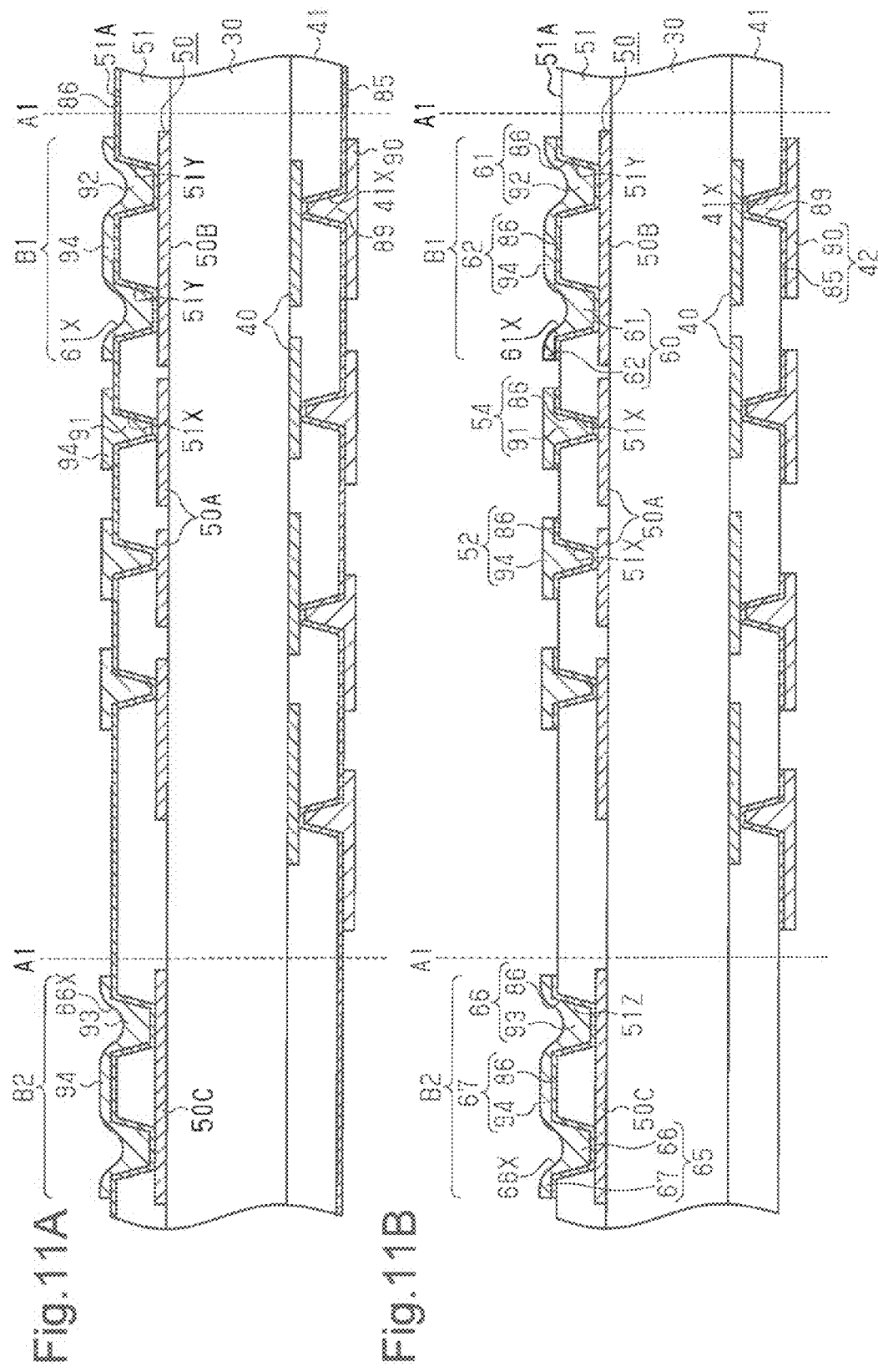

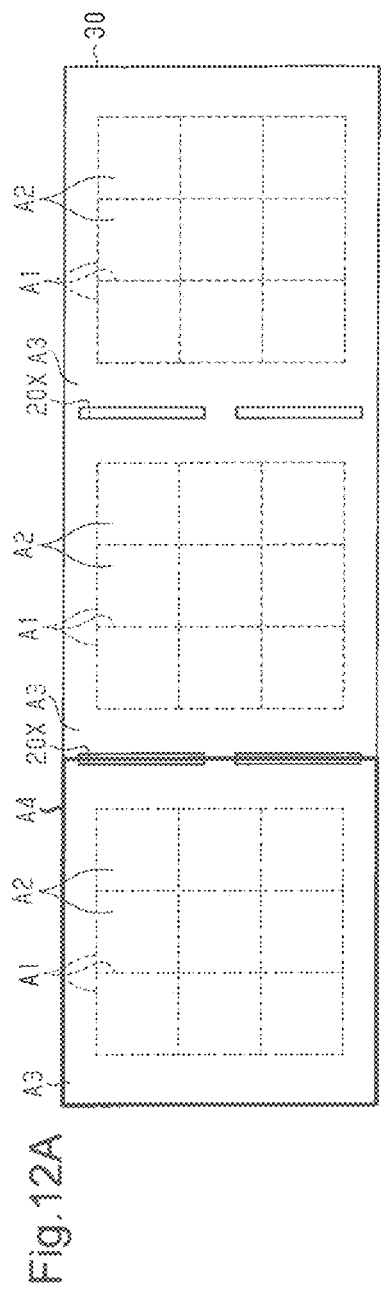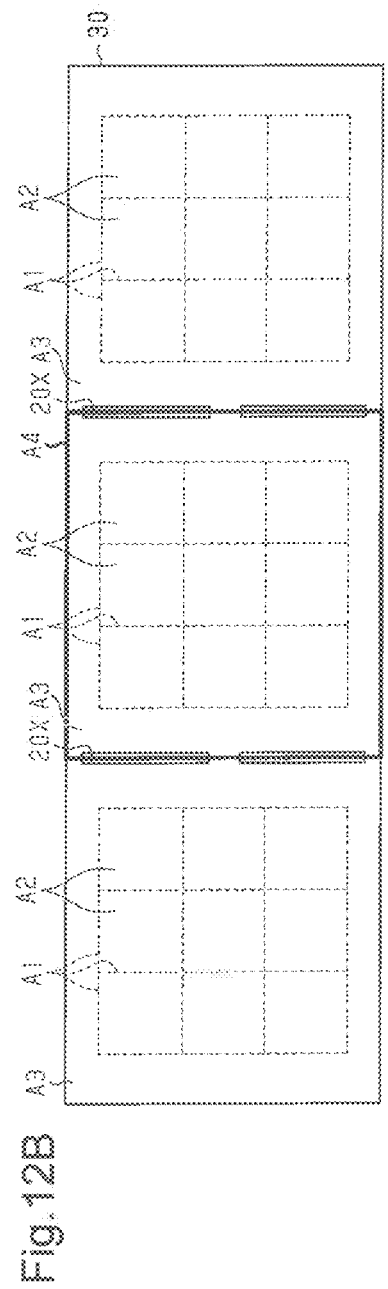

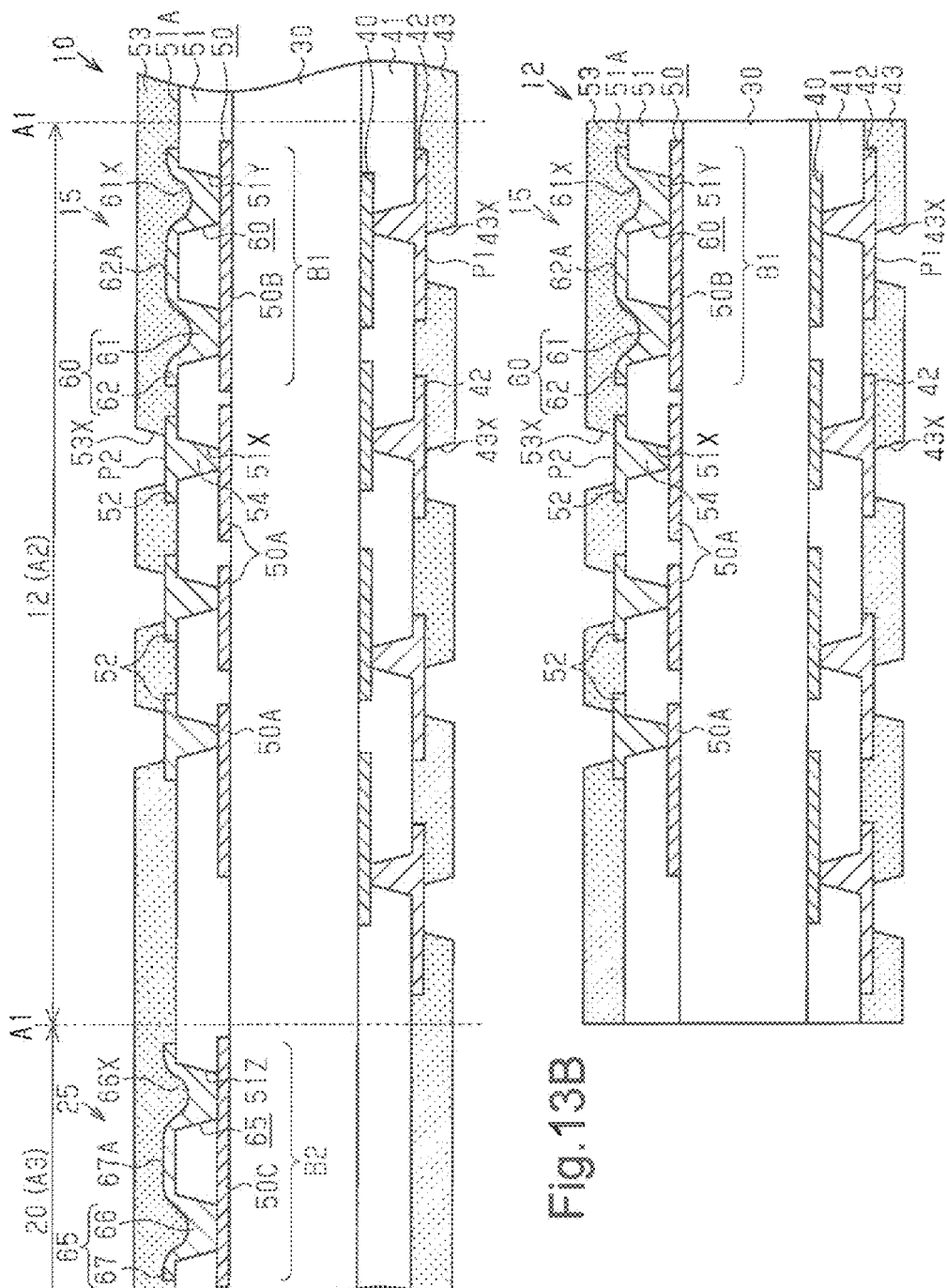

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2015-224688, filed on Nov. 17, 2015, the entire contents of which are incorporated herein by reference.

FIELD

This disclosure relates to a wiring substrate, a semiconductor device, and a method for manufacturing a wiring substrate.

BACKGROUND

Recent wiring substrates, on which semiconductor chips are mounted, have been miniaturized and increased in density and are handled in the form of a large wiring substrate that includes a plurality of wiring substrate units. Japanese Laid-Open Patent Publication Nos. 2009-194321 and 2005-252155 describes examples of such wiring substrates.

As illustrated in FIG. 16, a large wiring substrate 100 includes a plurality of (here, nine) wiring substrate units 101 and a frame 102 which surrounds the wiring substrate units 101. When cut at cutting positions A10, the wiring substrate 100 is singulated into individual wiring substrate units 101.

Each wiring substrate unit 101 includes an identification mark 103 which is identified as a particular character or a particular symbol in a plan view. In FIG. 16, nine identification marks 103 are identified as "B1" to "B9" in a plan view. Each identification mark 103 indicates position information or lot information of the wiring substrate unit 101.

The identification marks 103 are formed, for example, by boring through holes in the insulation layer and forming a plating layer in the through holes. The through holes are arranged to form a particular shape (e.g., "B1") that is identifiable in a plan view.

SUMMARY

There is a demand for better recognition of the identification marks 103 of the wiring substrate 100 (wiring substrate units 101). In this regard, there is room for further improvement.

One embodiment of a wiring substrate includes an insulation layer, first through holes that extend through the insulation layer in a thickness-wise direction and form a particular shape including a character or a symbol, first via wirings formed in the first through holes, a conductive pattern formed on an upper surface of the insulation layer and connected to the first via wirings, recesses formed in the first via wirings, and a protective insulation layer formed on the upper surface of the insulation layer to cover the conductive pattern and the first via wirings. The conductive pattern and the first via wirings are formed from the same material. Each of the recesses is defined by an upper surface of the corresponding first via wiring and includes a bottom wall that is located at a position that is lower than an upper surface of the conductive pattern. The recesses are filled with the protective insulation layer. The first via wirings, the conductive pattern, the recesses, and the protective insulation layer form an identification mark that is identifiable as the particular shape. Each of the recesses includes a curved side wall. The protective insulation layer is greater in thickness over the first via wirings than over the conductive pattern.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 1A is a schematic plan view illustrating one embodiment of a wiring substrate;

FIG. 1B is an enlarged plan view illustrating a portion of the wiring substrate illustrated in FIG. 1A;

FIG. 2A is a schematic cross-sectional view of the wiring substrate illustrated in FIG. 1B taken along line 2-2 in FIG. 1B;

FIG. 2B is a schematic cross-sectional view illustrating one embodiment of a wiring substrate unit;

FIGS. 7A, 7B, and 8A are schematic cross-sectional views of a method for manufacturing the wiring substrate illustrated in FIG. 2A;

FIG. 8B is an enlarged plan view illustrating a portion of FIG. 8A;

FIG. 8C is a plan view illustrating a method for manufacturing a reference example of an identification mark;

FIGS. 9A, 9B, 10A, 10B, 11A, and 11B are schematic cross-sectional views illustrating the method for manufacturing the wiring substrate following the step of FIG. 8A;

FIGS. 12A and 12B are schematic plan views of a step-and-repeat exposure process;

FIGS. 13A and 13B are schematic cross-sectional views illustrating the method for manufacturing the wiring substrate following the step of FIG. 11B;

DESCRIPTION OF THE EMBODIMENTS

Figure 3:
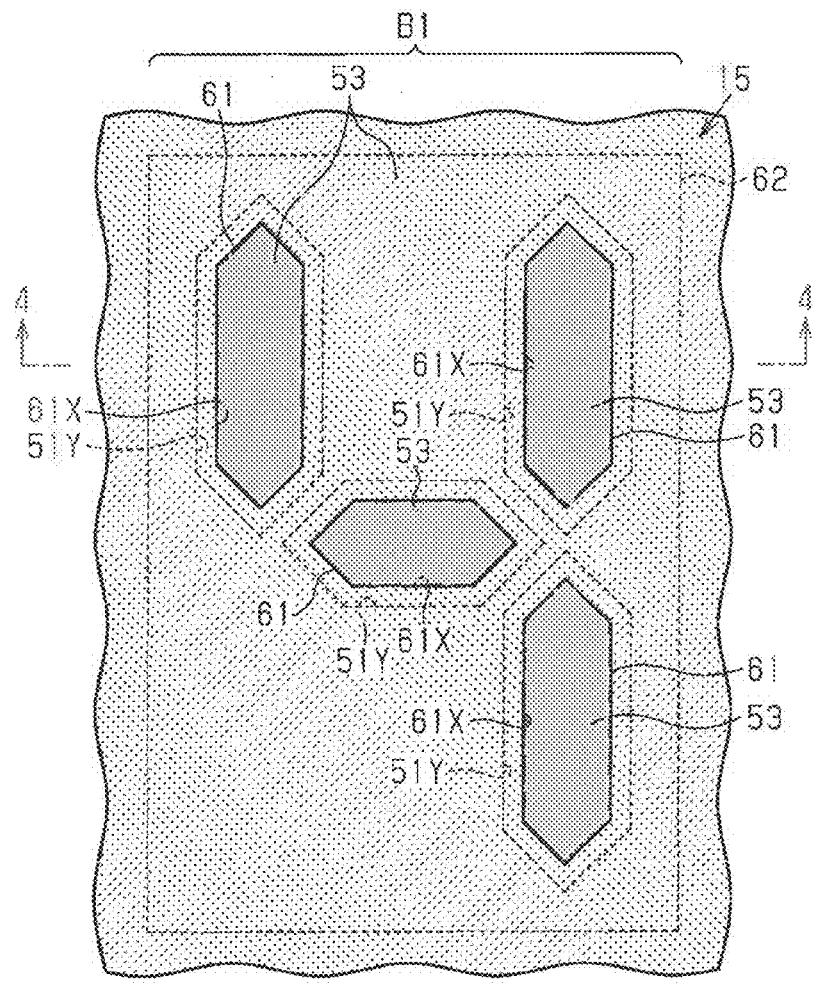
FIG. 3 is a schematic plan view illustrating one embodiment of an identification mark.

One embodiment will now be described with reference to the accompanying drawings. Elements in the drawings may be partially enlarged for simplicity and clarity and thus have not necessarily been drawn to scale. To facilitate understanding, hatching lines may not be illustrated or be replaced by shadings in the cross-sectional drawings.

The structure of a wiring substrate 10 will now be described with reference to FIGS. 1A to 4.

As illustrated in FIG. 1A, the wiring substrate 10 is, for example, a sheet of a wiring substrate that is rectangular in a plan view. The wiring substrate 10 includes a plurality of (here, three) blocks 11 and a frame 20 which surrounds the blocks 11. The blocks 11 are separated from one another. Each block 11 includes a plurality of wiring substrate units 12 arranged in a matrix (here, 3×3). When cut at cutting positions A1, the wiring substrate 10 is singulated into individual wiring substrate units 12. Hereafter, each of wiring substrate units 12 may be simply referred to as "wiring substrate 12". The frame 20 is discarded subsequent to the singulation.

Hereafter, in the description, the "plan view" refers to the view of a subject taken in the vertical direction in FIG. 2A (upper-lower direction in FIG. 2A). The "planar shape" refers to the shape of a subject as viewed in the vertical direction in FIG. 2A.

As illustrated in FIG. 1B, each wiring substrate 12 includes an identification mark 15, which is identified as a particular shape including a character or a symbol in a plan view. In the example illustrated in FIG. 1B, each block 11 includes a center left wiring substrate 12, which has an identification mark 15 identified as "4", and a center wiring substrate 12, which has an identification mark 15 identified as "5". The wiring substrates 12 that are not illustrated in FIG. 1B each include an identification mark 15 having different shapes. The identification marks 15 are used, for example, when the wiring substrates 12 have deficiencies after the singulation. The identification marks 15 may be used, for example, to specify the position of the wiring substrate 12 having a deficiency in the wiring substrate 10. This allows for an analysis of whether the deficiency is dependent on a particular position of the wiring substrate 10 or related to a particular process of manufacturing steps. Examples of the identification marks 15 include an identification number, coordinate information, a lot number, a serial number, a drawing number, a product name, and a recognition mark (alignment mark).

As illustrated in FIG. 1A, the frame 20 includes two rail portions 21, which extend in the longitudinal direction (sideward direction in FIG. 1A), and rail portions 22, which extend in the lateral direction (upper-lower direction in FIG. 1A). Each rail portion 22 located between adjacent ones of the blocks 11 includes a plurality of (here, two) slits 20X, which extend in the lateral direction. Each slit 20X extends through the rail portion 22 (wiring substrate 10) between the front surface and the rear surface of the rail portion 22 (wiring substrate 10).

As illustrated in FIG. 1B, each rail portion 22 includes an identification mark 25, which is identified as a particular shape including a character or a symbol in a plan view. In FIGS. 1A and 1B, only the rail portion 22 located at the leftmost side includes one identification mark 25. However, in an actual case, the rail portions 22 include a number of different kinds of identification marks 25. Although not illustrated in FIG. 1A, the rail portions 21 also include a number of different kinds of identification marks 25. In the example illustrated in FIG. 1B, the rail portion 22 includes the identification mark 25 identified as the symbol "□". Examples of the identification marks 25 include an identification number, coordinate information, a lot number, a serial number, a drawing number, a product name, and a recognition mark of the block 11.

As illustrated in FIG. 2A, the wiring substrate 10 includes a substrate body 30. The substrate body 30 may be, for example, a core substrate, a build-up core substrate having a core substrate, or a coreless substrate which does not have a core substrate.

The substrate body 30 includes a lower surface on which a wiring layer 40, an insulation layer 41, a wiring layer 42, and a solder resist layer 43 (protective insulation layer) are sequentially formed. The substrate body 30 also includes an upper surface on which a wiring layer 50, an insulation layer 51, a wiring layer 52, and a solder resist layer 53 (protective insulation layer) are sequentially formed.

The material of the wiring layers 40, 42, 50, 52 may be, for example, copper (Cu) or a copper alloy. The material of the insulation layers 41, 51 may be, for example, an insulative resin such as an epoxy resin or a polyimide resin or a resin material formed by mixing the insulative resin with a filler such as silica ($SiO_2$) or alumina ($Al_2O_3$).

The wiring layer 40 is electrically connected to the wiring layer 50 by a wiring layer and a through electrode located in the substrate body 30. The insulation layer 41 is formed on the lower surface of the substrate body 30 to cover the wiring layer 40. The wiring layer 42 is formed on the lower surface of the insulation layer 41. The wiring layer 42 is electrically connected to the wiring layer 40 by via wirings that extend through the insulation layer 41 in the thicknesswise direction.

The solder resist layer 43 is formed on the lower surface of the insulation layer 41 to partially cover the wiring layer 42 which is the lowermost wiring layer. The solder resist layer 43 includes openings 43X to expose portions of the wiring layer 42 as external connection pads P1. The external connection pads P1 are connected to external connection terminals 74 (refer to FIG. 5), which are used to mount the wiring substrate 12 on a mount substrate such as a motherboard. More specifically, the wiring substrate 12 includes a lower surface that includes the external connection pads P1 and functions as an external connection terminal surface.

If necessary, a surface-processed layer may be formed on the wiring layer 42 that is exposed in the openings 43X. The surface-processed layer may be, for example, a gold (Au) layer, a nickel (Ni) layer/Au layer (Ni layer and Au layer are sequentially formed), or an Ni layer/Palladium (Pd) layer/Au layer (Ni layer, Pd layer, and Au layer are sequentially formed). The Au layer, the Ni layer, and the Pd layer may each be, for example, an electroless plating metal layer formed through an electroless plating process. The Au layer is a metal layer formed from Au or an Au alloy. The Ni layer is a metal layer formed from Ni or an Ni alloy. The Pd layer is a metal layer formed from Pd or a Pd alloy. Also, an anti-oxidization process such as an organic solderability preservative (OSP) process may be performed on surfaces of the external connection pads P1 to form a surface-processed layer. For example, when the OSP process is performed, an organic coating of an azole compound, an imidazole compound, or the like is formed on the surfaces of the external connection pads P1 as the surface-processed layer. The wiring layer 42 that is exposed in the openings 43X may be used as external connection terminals. Alternatively, the surface-processed layer formed on the wiring layer 42 may be used as an external connection terminal.

The material of the solder resist layer 43 may be, for example, a photosensitive insulative resin containing a phenol resin or a polyimide resin as the main component. The solder resist layer 43 may include, for example, a filler such as silica or alumina.

The wiring layer 50 is formed on the upper surface of the substrate body 30. The wiring layer 50 includes a wiring pattern 50A, a wiring pattern 50B, and a wiring pattern 50C. The wiring pattern 50A is electrically connected to a semiconductor chip 71 (refer to FIG. 5), which is mounted on each wiring substrate 12. The wiring pattern 50B is located in a region B1 where the identification mark 15 is formed. The wiring pattern 50C is located in a region B2 where the identification mark 25 is formed.

The insulation layer 51 is formed on the upper surface of the substrate body 30 to cover the wiring layer 50 (wiring patterns 50A, 50B, 50C). In each wiring substrate 12, the insulation layer 51 includes an upper surface 51A. Through holes 51X extend through the insulation layer 51 from the upper surface 51A in the thickness-wise direction and partially expose the upper surface of the wiring pattern 50A. Each through hole 51X is tapered so that the diameter decreases from the upper side (upper surface 51A of insulation layer 51) toward the lower side (lower surface of insulation layer 51) in FIG. 2A. The through hole 51X has the form of, for example, an inverted truncated cone in which the upper open end has a larger diameter than the lower open end. The thickness of the wiring patterns 50A, 50B, 50C may be, for example, approximately 10 to 50 μm from the upper surface of the wiring patterns 50A, 50B, 50C to the upper surface 51A of the insulation layer 51.

A via wiring 54 is formed in each through hole 51X to electrically connect the wiring pattern 50A and the wiring layer 52. In the present example, each through hole 51X is filled with the via wiring 54. The wiring layer 52 is formed on the upper surface 51A of the insulation layer 51. The wiring layer 52 is formed, for example, integrally with the via wirings 54. The material of the via wirings 54 may be, for example, copper or a copper alloy.

The solder resist layer 53 is formed on the upper surface 51A of the insulation layer 51 to partially cover the wiring layer 52, which is the uppermost wiring layer. The solder resist layer 53 includes openings 53X, which expose portions of the wiring layer 52 as connection pads P2. The semiconductor chip 71 (refer to FIG. 5) includes bumps 72, which are flip-chip-bonded to the connection pads P2. More specifically, the wiring substrate 12 includes an upper surface that includes the connection pads P2 and functions as a surface on which a chip is mounted. If necessary, a surface-processed layer may be formed on the wiring layer 52 that is exposed in the openings 53X. The surface-processed layer may be, for example, an Au layer, an Ni layer/Au layer, an Ni layer/Pd layer/Au layer, or an organic coating formed through the OSP process.

The material of the solder resist layer 53 may be, for example, translucent. The translucent material may be, for example, bluish green. The bluish green translucent material may be, for example, a resin material of an insulative resin such as an epoxy resin or an acrylic resin including bluish green pigment. Additionally, the solder resist layer 53 may include, for example, a filler such as silica or alumina. However, the material of the solder resist layer 53 does not necessarily have to be translucent as long as the color tone of an insulative resin increases the contrast of the identification marks 15, 25 and does not adversely affect the recognizability of the identification marks 15, 25.

The identification marks 15, 25 are formed on the chip mount surface of the wiring substrate 10. The structure of the identification marks 15, 25 will now be described. Firstly, the structure of the identification mark 15 and its surrounding will be described.

As illustrated in FIG. 3, the identification mark 15 has a planar shape that is identifiable as a particular character or a particular symbol. In the example illustrated in FIG. 3, the identification mark 15 is identifiable as a seven-segment character "4". A seven-segment display uses seven lines (segments) to indicate a single-digit numeral (character) or symbol.

As illustrated in FIG. 2A, the identification mark 15 is formed in the region B1 of the wiring substrate 12. In the region B1, a wiring pattern 50B is formed in a solid form on the upper surface of the substrate body 30. That is, the wiring pattern 50B is a solid pattern that extends throughout the region B1. The wiring pattern 50B is, for example, located in a position that overlaps with the identification mark 15 in a plan view and larger than the entire identification mark 15.

In the region B1, through holes 51Y extend through the insulation layer 51 from the upper surface 51A in the thickness-wise direction to expose portions of the upper surface of the wiring pattern 50B. Each through hole 51Y is tapered so that the width decreases from the upper side (upper surface 51A of insulation layer 51) toward the lower side (lower surface of insulation layer 51) in FIG. 2A. Each through hole 51Y has a larger volume than each through hole 51X. The through holes 51Y are, for example, larger than the through holes 51X in a plan view.

As illustrated in FIG. 3, the through holes 51Y shape a particular character or a particular symbol that is identifiable as the identification mark 15. In the present example, a seven-segment numeral "4" is shaped. In this case, as illustrated in FIG. 3, the region B1 includes four through holes 51Y, which are polygonal in a plan view and located at positions corresponding to the four lines (segments) that shape the seven-segment numeral "4" as a whole image in a plan view. The through holes 51Y are spaced apart from one another. The width of each through hole 51Y may be, for example, approximately 50 to 200 μm.

Figure 4:
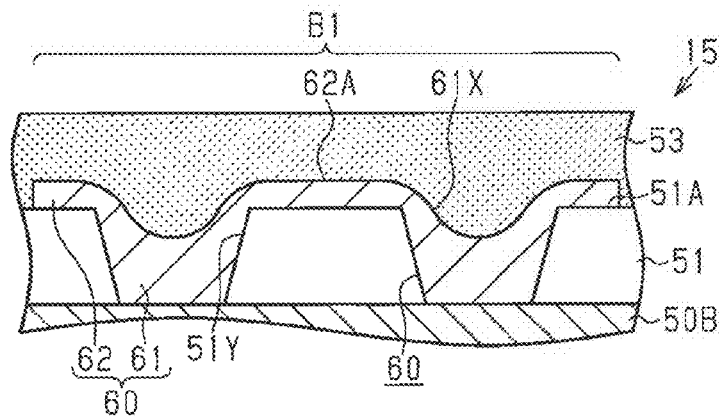
FIG. 4 is a schematic cross-sectional view of the identification mark illustrated in FIG. 3 taken along line 4-4 in FIG. 3.

As illustrated in FIG. 4, the region B1 also includes a conductive layer 60. The conductive layer 60 includes via wirings 61, which are formed in the through holes 51Y, and a conductive pattern 62, which is connected to the via wirings 61 and formed on the upper surface 51A of the insulation layer 51.

Each through hole 51Y is partially filled with the corresponding via wiring 61. In the present example, the bottom of the through hole 51Y is filled with the via wiring 61 so that the via wiring 61 covers an inner wall of the insulation layer 51 defining the through hole 51Y and the upper surface of the wiring pattern 50B. Each via wiring 61 includes an upper surface defining a recess 61X. The recess 61X extends toward the wiring pattern 50B (i.e., toward lower surface of via wiring 61) from an upper surface 62A of the conductive pattern 62. In the present example, the recess 61X extends toward the wiring pattern 50B further from the upper surface 51A of the insulation layer 51. Thus, the recess 61X includes a bottom wall (defined by upper surface of via wiring 61) that is located at a position that is lower than the upper surface 62A of the conductive pattern 62 and the upper surface 51A of the insulation layer 51. The recess 61X also includes a curved side wall. In the present example, the recess 61X is semicircular in a cross-sectional view. Thus, the side wall and the bottom wall of the recess 61X are both curved. The side wall of the recess 61X is continuous with the upper surface 62A of the conductive pattern 62.

As illustrated in FIG. 3, the recesses 61X form a particular character or a particular symbol that is identifiable as the identification mark 15. In the present example, the seven-segment numeral "4" is formed. That is, four recesses 61X, which are polygonal in a plan view, are located at positions corresponding to four segments that shape the seven-segment numeral "4" as a whole image in a plan view. Each recess 61X has the same planar shape as the corresponding through hole 51Y and is slightly smaller than the through hole 51Y. The recesses 61X are spaced apart from one another. The width of each recess 61X may be, for example, approximately 40 to 190 μm.

As illustrated in FIG. 4, the conductive pattern 62 is, for example, electrically connected to the wiring pattern 50B by the via wirings 61. The conductive pattern 62 connects adjacent ones of the via wirings 61. The conductive pattern 62 is formed, for example, on the upper surface 51A of the insulation layer 51 to extend throughout the region B1. The conductive pattern 62 is formed, for example, integrally with the via wirings 61. The via wirings 61 and the conductive pattern 62 may be formed from the same material. The material of the via wirings 61 and the conductive pattern 62 may be, for example, copper or a copper alloy.

In the region B1, the recesses 61X are filled with the solder resist layer 53. The solder resist layer 53 covers the entire surface (upper surface) of each via wiring 61 and the entire surfaces (upper and side surfaces) of the conductive pattern 62. The solder resist layer 53 includes a flat upper surface. Since the recesses 61X are filled with the solder resist layer 53, the thickness of the solder resist layer 53 is greater over the via wirings 61 than over the conductive pattern 62. As illustrated in FIG. 3, the difference in the thickness of the solder resist layer 53 increases the difference in concentration (contrast) of the solder resist layer 53 between a portion corresponding to the recesses 61X and the remaining portion. In the present example, when the identification mark 15 is viewed from the upper side of FIG. 4 (i.e., upper side of conductive layer 60), the contrast of the solder resist layer 53 is increased between a portion that overlaps with the recesses 61X in a plan view and a portion that overlaps with the conductive pattern 62 in a plan view. Thus, in the region B1, the particular shape (here, seven-segment numeral "4") formed by the recesses 61X can be easily recognized (identified) as the identification mark 15.

As describe above, in the present example, the identification mark 15 is formed by the via wirings 61, which are formed in the through holes 51Y, the conductive pattern 62, which connects the via wirings 61, the recesses 61X, which are defined by the upper surfaces of the via wirings 61, and the solder resist layer 53, which fills the recesses 61X and covers the via wirings 61 and the conductive pattern 62.

The structure of the identification mark 25 will now be described. The identification mark 25 has the same cross-sectional structure as the identification mark 15 and thus will not be described in detail.

As illustrated in FIG. 1B, the identification mark 25 has a planar shape that is identifiable as a particular character or a particular symbol. In the example illustrated in FIG. 1B, the identification mark 25 is identifiable as a seven-segment symbol "☐" indicated by four segments of the seven-segment display.

As illustrated in FIG. 2A, the identification mark 25 is formed in the region B2 which is located outside the wiring substrate 12. In the region B2, through holes 51Z extend through the insulation layer 51 from the upper surface 51A in the thickness-wise direction to expose the upper surface of the wiring pattern 50C. The through holes 51Z shape the symbol "☐". Each through hole 51Z has a larger volume than each through hole 51X.

The region B2 also includes a conductive layer 65. The conductive layer 65 includes via wirings 66, which are formed in the through holes 51Z, and a conductive pattern 67, which is connected to the via wirings 66 and formed on the upper surface 51A of the insulation layer 51. In the same manner as the recesses 61X, each via wiring 66 includes an upper surface that defines a recess 66X. The recess 66X includes a bottom wall that is located at a position that is lower than an upper surface 67A of the conductive pattern 67 and the upper surface 51A of the insulation layer 51. Each recess 66X is slightly smaller than the corresponding through hole 51Z in a plan view. The recesses 66X shape the symbol "☐". In the region B2, the recesses 66X are filled with the solder resist layer 53. The solder resist layer 53 covers the entire surface (upper surface) of each via wiring 66 and the entire surfaces (upper and side surfaces) of the conductive pattern 67. In the present example, the identification mark 25 is formed by the via wirings 66, which are formed in the through holes 51Z, the conductive pattern 67, which connects the via wirings 66, the recesses 66X, which are defined by the upper surfaces of the via wirings 66, and the solder resist layer 53, which fills the recesses 66X and covers the via wirings 66 and the conductive pattern 67.

When the substrate body 30, the insulation layers 41, 51, and the solder resist layers 43, 53 are cut at the cutting positions A1 illustrated in FIG. 2A, the wiring substrate 10 is singulated into the wiring substrates 12, one of which is illustrated in FIG. 2B. Each wiring substrate 12 includes the identification mark 15 even after the cutting.

Figure 5:
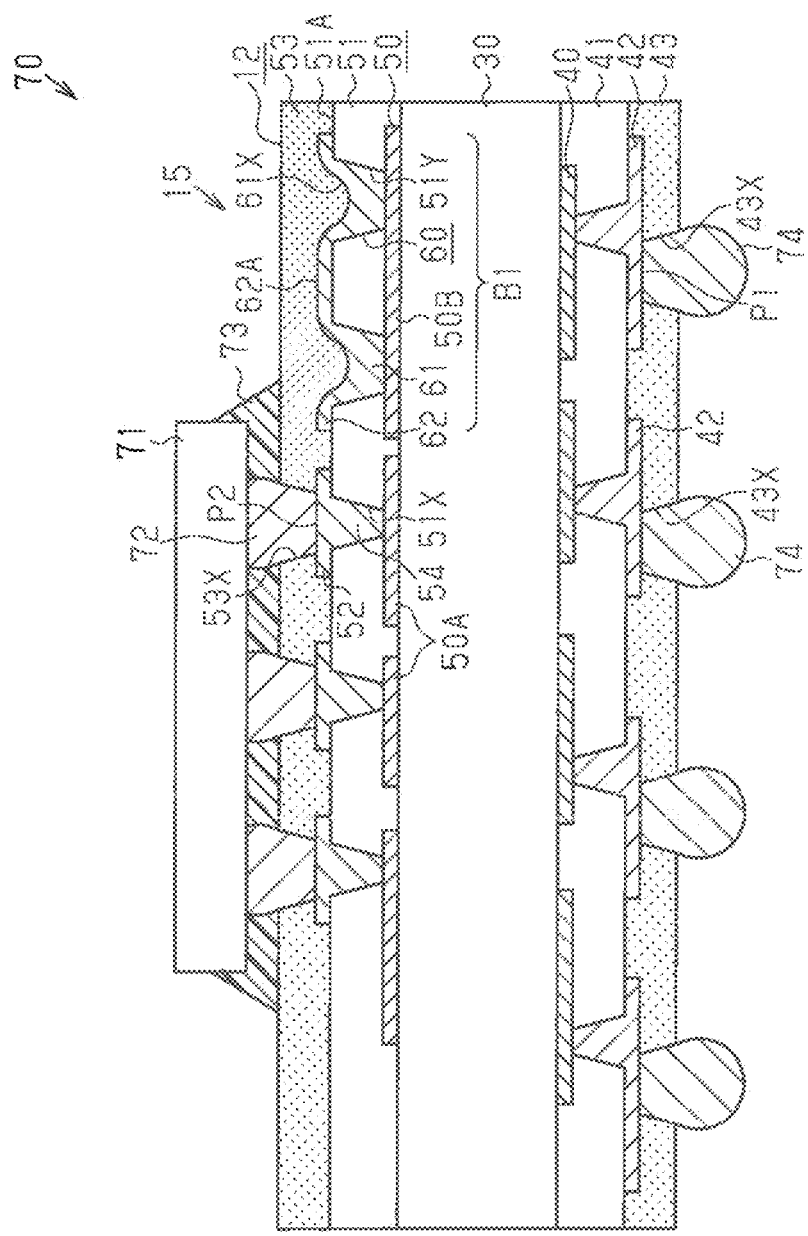
FIG. 5 is a schematic cross-sectional view illustrating one embodiment of a semiconductor device.

The structure of a semiconductor device 70 including the wiring substrate 12 will now be described with reference to FIG. 5.

The semiconductor device 70 includes the wiring substrate 12, the semiconductor chip 71, which is mounted on the wiring substrate 12, an underfill resin 73, and the external connection terminals 74.

The semiconductor chip 71 is, for example, flip-chip-mounted on the wiring substrate 12. In the present example, the bumps 72, which are arranged on a surface (here, lower surface) of the semiconductor chip 71 where the circuit is formed, are bonded to the connection pads P2 of the wiring substrate 12. Consequently, the semiconductor chip 71 is electrically connected to the wiring layer 52 of the wiring substrate 12 by the bumps 72.

The semiconductor chip 71 may be, for example, a logic chip such as a central processing unit (CPU) chip or a graphics processing unit (GPU) chip. Alternatively, the semiconductor chip 71 may be, for example, a memory chip such as a dynamic random access memory (DRAM) chip, a static random access memory (SRAM) chip, or a flash memory. Further, a plurality of semiconductor chips 71 including the combination of a logic chip and a memory chip may be mounted on the wiring substrate 12.

The bumps 72 may be, for example, gold bumps or solder bumps. The material of the solder bumps may be, for example, an alloy containing lead, an alloy of Sn and Au, an alloy of Sn and Cu, an alloy of Sn and Ag, an alloy of Sn, Ag, and Cu, or the like.

The underfill resin 73 fills a gap formed between the wiring substrate 12 and the semiconductor chip 71. The material of the underfill resin 73 may be, for example, an insulative resin such as an epoxy resin.

The external connection terminals 74 are arranged on the external connection pads P1 of the wiring substrate 12. The external connection terminals 74 are used, for example, to be electrically connected to pads arranged on a mount substrate such as a motherboard (not illustrated). The external connection terminals 74 may be, for example, solder balls or lead pins. In the present embodiment, the external connection terminals 74 are solder balls.

Figure 6A:
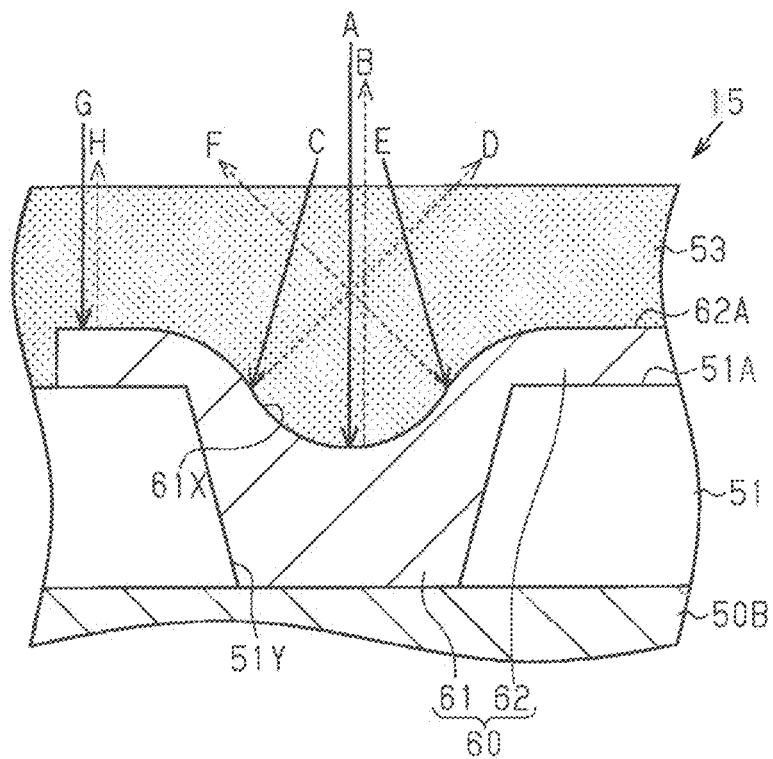
FIG. 6A is a diagram illustrating the operation of the identification mark illustrated in FIG. 4.

FIG. 6A illustrates the operation of the identification mark 15 illustrated in FIG. 4. For comparison, FIG. 6B illustrates the operation of an identification mark 15A formed on a related art wiring substrate.

The related art identification mark 15A will now be described with reference to FIG. 6B. The identification mark 15A is formed by a through hole 111X, which extends through an insulation layer 111 that covers a wiring pattern 110, and a plating layer 112, which is formed in the through hole 111X and on the upper surface of the insulation layer 111. The plating layer 112 continuously covers the upper surface of the wiring pattern 110 that is exposed in the through hole 111X, an inner wall in the insulation layer 111 defining the through hole 111X, and the upper surface of the insulation layer 111. The through hole 111X is tapered so that the diameter decreases from the upper side toward the lower side in FIG. 6B. Thus, the plating layer 112, which covers the inner wall of the insulation layer 111 in the through hole 111X, is linearly inclined relative to the upper surface of the wiring pattern 110. More specifically, the plating layer 112 includes a flat side surface. Also, the plating layer 112 includes a flat bottom surface. In the identification mark 15A, an incident ray A that is perpendicularly incident relative to the upper surface of the wiring pattern 110 is reflected on the bottom surface of the plating layer 112, which is located on the upper surface of the wiring pattern 110, as a reflected ray B. The reflected ray B is reflected in a vertically upward direction. Incident rays C, E that are obliquely incident relative to the upper surface of the wiring pattern 110 are reflected on the side surface of the plating layer 112 in the through hole 111X. The side surface of the plating layer 112 is flat. Thus, diffuse reflection (irregular reflection) is limited on the side surface of the plating layer 112. Thus, in the identification mark 15A, the difference in intensity is decreased between a reflected ray H of an incident ray G that is incident on the plating layer 112 located on the upper surface of the insulation layer 111 and a reflected ray that is reflected upward from the plating layer 112 located in the through hole 111X. This diminishes the contrast between the plating layer 112 formed in the through hole 111X and the plating layer 112 formed on the upper surface of the insulation layer 111 and adversely affects the recognizability of the identification mark 15A.

Figure 6B:
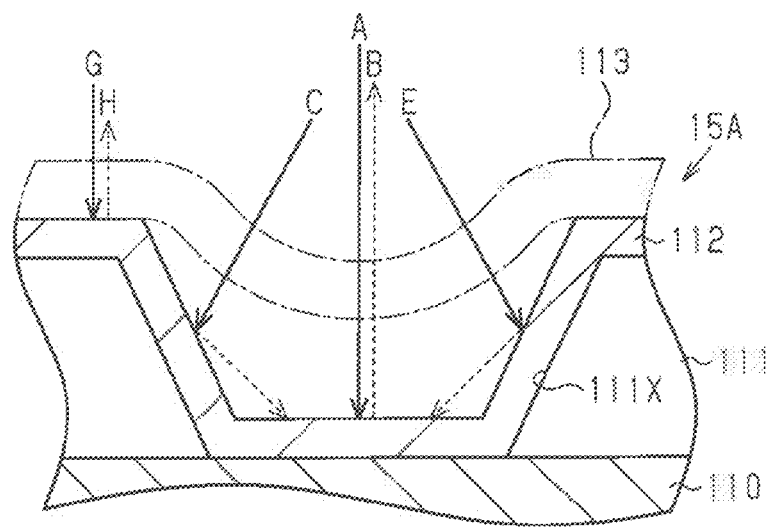
FIG. 6B is a diagram illustrating the operation of a related art identification mark.

Additionally, when the plating layer 112 has the form illustrated in FIG. 6B and a solder resist layer 113 (indicated by single-dashed line) is formed on the plating layer 112, the solder resist layer 113 sags in the through hole 111X. This deteriorates the flatness of the upper surface of the solder resist layer 113 and adversely affects the recognizability of the identification mark 15A.

In this regard, as illustrated in FIG. 6A, the identification mark 15 of the present embodiment is formed by the via wiring 61, which is formed in the through hole 51Y, the conductive pattern 62, the recess 61X, which is defined by the upper surface of the via wiring 61, and the solder resist layer 53, which fills the recess 61X and the covers the via wiring 61 and the conductive pattern 62. Additionally, the side wall and the bottom wall of the recess 61X are both curved. Hence, diffuse reflection (irregular reflection) tends to occur particularly on the side wall of the recess 61X. Thus, the incident rays C, E, which are obliquely incident relative to the upper surface of the wiring pattern 50B, are upwardly reflected on the side wall of the recess 61X as indicated by reflected rays D, F. This increases the difference in intensity between the reflected ray H, which is upwardly reflected from the conductive pattern 62, and a reflected ray that is upwardly reflected from the via wiring 61 (recess 61X) as compared to the related art identification mark 15A. Consequently, the contrast is increased between the upper surface 62A of the conductive pattern 62 and the upper surface of the via wiring 61. This improves the recognizability of the identification mark 15 (i.e., shape formed by recess 61X).

Additionally, in the identification mark 15, the thickness of the solder resist layer 53 is greater over the via wirings 61 than over the conductive pattern 62. This increases the contrast in the solder resist layer 53 between a portion located over the via wirings 61 and a portion located over the conductive pattern 62. Consequently, the recognizability of the identification mark 15 is further improved.

Additionally, in the identification mark 15, the bottom of each through hole 51Y is filled with the via wiring 61. This lifts the bottom wall of each recess 61X. Thus, even when the solder resist layer 53 sags in the recesses 61X, the recesses 61X are filled with the solder resist layer 53. This improves the flatness of the upper surface of the solder resist layer 53 as compared to the related art identification mark 15A. Consequently, the recognizability of the identification mark 15 is further improved. The recognizability of the identification mark 25 is also improved in the same manner as the identification mark 15.

A method for manufacturing the wiring substrate 10 will now be described. For the sake of simplicity, portions that ultimately become elements of the wiring substrate 10 are indicated by reference characters used to denote the final elements.

In the step of FIG. 7A, the substrate body 30 is prepared. The substrate body 30 includes substrate formation regions A2 (only one of them is illustrated in FIG. 7A), in which the wiring substrates 12 (refer to FIG. 2A) are formed, and a frame formation region A3, which is located outside the substrate formation regions A2 and forms the frame 20 (refer to FIG. 2A). The wiring layer 50, which includes the wiring patterns 50A, 50B, 50C, is formed on the upper surface of the substrate body 30. The wiring layer 40 is formed on the lower surface of the substrate body 30. The wiring layers 40, 50 may be formed, for example, through various kinds of wiring formation processes such as a semi-additive process or a subtractive process.

In the step of FIG. 7B, a structural body 81 is formed on the lower surface of the substrate body 30, and a structural body 83 is formed on the upper surface of the substrate body 30. The structural body 81 includes a carrier layer 80 and a sheet of the insulation layer 41, which is formed on the upper surface of the carrier layer 80 with a release agent (separation layer) located in between. In the same manner, the structural body 83 includes a carrier layer 82 and a sheet of the insulation layer 51, which is formed on the lower surface of the carrier layer 82 with a release agent (separation layer) located in between. An insulative material that is in a B-stage (semi-cured) state is used as the insulation layers 41, 51. The carrier layers 80, 82 function as support members that facilitate the handling of the insulation layers 41, 51. The carrier layers 80, 82 may each be, for example, a polyethylene terephthalate (PET) film, a polyimide (PI) film, or a polyethylene naphthalate (PEN) film. The release agent may be, for example, a silicone release agent, a fluorine release agent, or an alkyd resin release agent.

The structural bodies 81, 83 are pressurized and heated at a temperature of approximately 110° C. to 130° C. in a vacuum atmosphere. This presses the wiring layer 40 into the insulation layer 41 and the wiring layer 50 (wiring patterns 50A, 50B, 50C) into the insulation layer 51. Subsequently, the insulation layers 41, 51 are cured at a temperature of approximately 170° C. to 190° C. through a curing (thermal curing) process. In this step, the structural body 81, in which the insulation layer 41 and the carrier layer 80 are sequentially formed, is formed on the lower surface of the substrate body 30, and the structural body 83, in which the insulation layer 51 and the carrier layer 82 are sequentially formed, is formed on the upper surface of the substrate body 30.

The carrier layers 80, 82 may be omitted. In this case, when a liquid or paste of an insulative resin is used as the insulation layers 41, 51, the insulative resin liquid or paste may be applied to the upper and lower surfaces of the substrate body 30 through spin coating or the like. Then, the applied insulative resin may be heated and cured at a temperature of approximately 130° C. to 190° C. to form the insulation layers 41, 51.

In the step of FIG. 8A, the through holes 41X are formed in the insulation layer 41, and the through holes 51X, 51Y, 51Z are formed in the insulation layer 51. The through holes 41X, 51X, 51Y, 51Z may be formed, for example, through laser cutting using a $CO_2$ laser or a YAG laser. In the present example, when the carrier layers 80, 82 are formed on the insulation layers 41, 51, laser cutting is performed to form the through holes 41X, 51X, 51Y, 51Z. The through holes 41X extend through the carrier layer 80 and the insulation layer 41 in the thickness-wise direction to expose portions of the lower surface of the wiring layer 40. The through holes 51X, 51Y, 51Z extend through the carrier layer 82 and the insulation layer 51 in the thickness-wise direction to expose portions of the upper surfaces of the wiring patterns 50A, 50B, 50C.

Each of the through holes 51Y, 51Z has a larger volume than each through hole 51X. The whole image of the through holes 51Y shapes a particular character or a particular symbol in a plan view. In the same manner, the whole image of the through holes 51Z shapes a particular character or a particular symbol in a plan view. In the present example, as illustrated in FIG. 8B, the whole image of the through holes 51Y shapes the seven-segment numeral "4" in a plan view. In the present example, the four through holes 51Y are located at positions corresponding to the four segments that indicate the seven-segment numeral "4". Each through hole 51Y has the shape of the corresponding segment in a plan view. Each through hole 51Y exposes the upper surface of the wiring pattern 50B. In the same manner, the whole image of the through holes 51Z shapes a particular shape in a plan view. In the present example, the symbol "□" is shaped as illustrated in FIG. 1B.

The through holes 41X, 51X, 51Y, 51Z, which are illustrated in FIG. 8A, may be formed after the carrier layers 80, 82 are removed. When a photosensitive resin is used to form the insulation layers 41, 51, for example, a photolithography process may be performed to form the through holes 41X, 51X, 51Y, 51Z.

Subsequently, the carrier layers 80, 82 are removed. For example, the carrier layer 80 is mechanically removed from the insulation layer 41, and the carrier layer 82 is mechanically removed from the insulation layer 51. Here, when a single through hole 51Y shapes, for example, an Arabic numeral "4" as illustrated in FIG. 8C, the carrier layer 82 includes a segregate portion 82A, which is surrounded by the through hole 51Y and segregated from the remaining portion. If the carrier layer 82 is mechanically removed when the segregate portion 82A is formed, the segregate portion 82A (i.e., portion of carrier layer 82) remains on the insulation layer 51. In this regard, as illustrated in FIG. 8B, when the through holes 51Y shape the seven-segment numeral "4", the through holes 51Y are spaced apart from one another. Thus, the segregate portion 82A illustrate in FIG. 8B is not formed. This allows the mechanical removal to remove the entire carrier layer 82. Thus, the carrier layer 80 does not partially remain on the insulation layer 51.

Figures 9A, 9B:
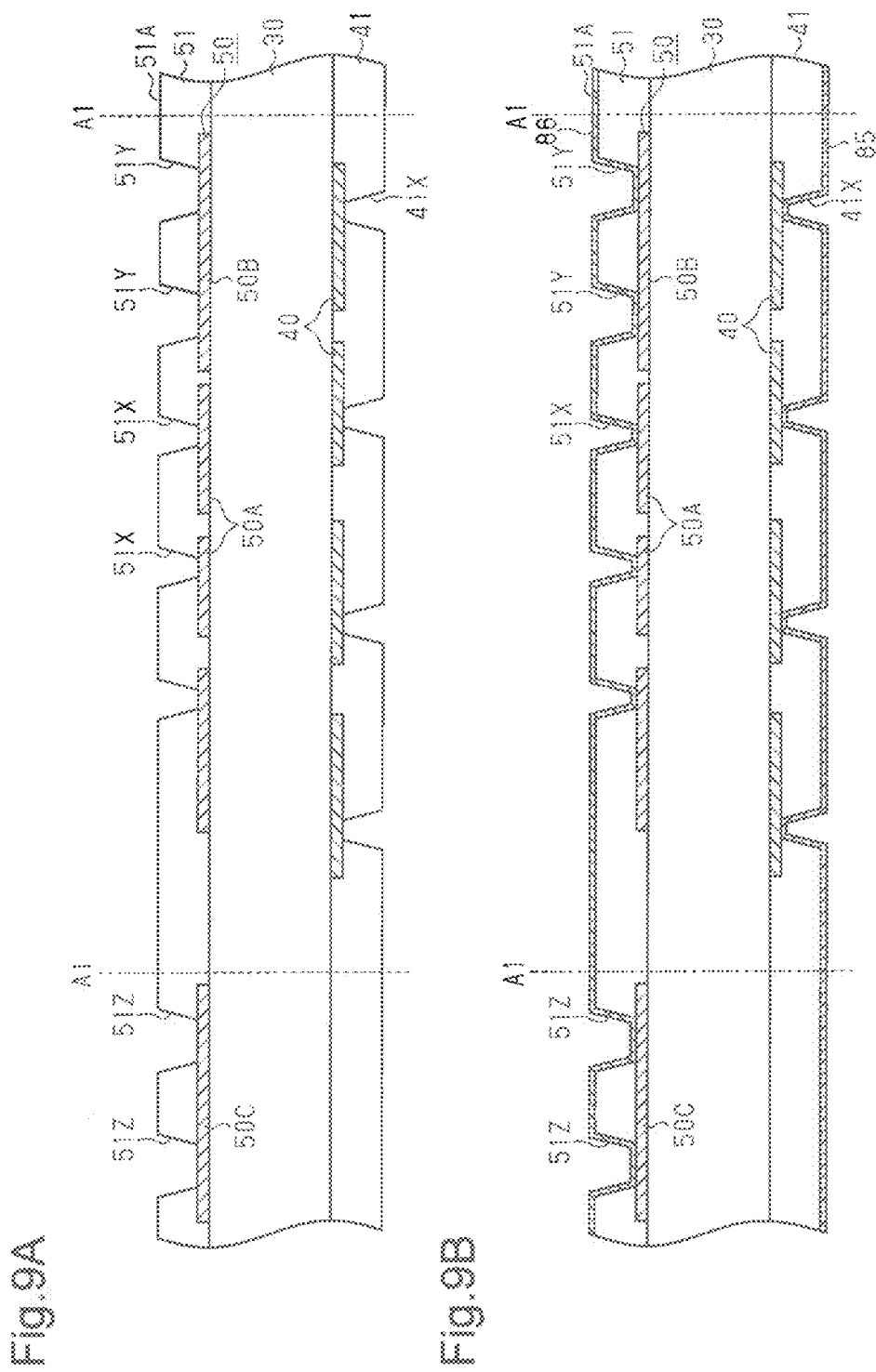

As illustrated in FIG. 9A, the removal of the carrier layers 80, 82 (refer to FIG. 8A) exposes the lower surface of the insulation layer 41 and the upper surface 51A of the insulation layer 51 to the exterior. When the carrier layers 80, 82 are omitted in the steps of FIGS. 7B and 8A, this step may be omitted.

When the through holes 41X, 51X, 51Y, 51Z are formed through laser cutting, a desmear process is performed. Consequently, resin smears are removed from the lower surface of the wiring layer 40 exposed through the through holes 41X and the upper surface of the wiring layer 50 exposed through the through holes 51X, 51Y, 51Z.

In the step of FIG. 9B, seed layers 85, 86 are formed. The seed layer 85 continuously covers the entire lower surface of the insulation layer 41, the entire inner surfaces of the insulation layer 41 defining the through holes 41X, and the entire lower surface of the wiring layer 40 exposed through the through holes 41X. The seed layer 86 continuously covers the entire upper surface 51A of the insulation layer 51, the entire inner surfaces of the insulation layer 51 defining the through holes 51X, 51Y, 51Z, and the entire upper surface of the wiring layer 50 exposed through the through holes 51X, 51Y, 51Z. The seed layers 85, 86 may be formed, for example, through sputtering or an electroless plating process. The material of the seed layers 85, 86 may be, for example, copper or a copper alloy. The seed layers 85, 86 may each have, for example, a structure in which metal films are layered. Such seed layers 85, 86 may be formed, for example, by sequentially forming a metal film of titanium nitride, tantalum nitride (TaN), tantalum (Ta), or chromium (Cr) and a metal film of copper or a copper alloy. Titanium nitride and tantalum nitride have higher corrosion resistance and higher adhesiveness to the insulation layers 41, 51 than copper.

In the step of FIG. 10A, a resist layer 87, which includes opening patterns 87X at given locations, is formed on the seed layer 85. Also, a resist layer 88, which includes opening patterns 88X, 88Y, 88Z at given locations, is formed on the seed layer 86. The opening patterns 87X expose the seed layer 85 at portions corresponding to regions where the wiring layer 42 (refer to FIG. 2A) is formed. The opening patterns 88X expose the seed layer 86 at portions corresponding to regions where the wiring layer 52 (refer to FIG. 2A) is formed. The opening pattern 88Y exposes the entire surface of the seed layer 86 in the region B1, where the identification mark 15 (refer to FIG. 2A) is formed. The opening pattern 88Z exposes the entire surface of the seed layer 86 in the region B2, where the identification mark 25 (refer to FIG. 2A) is formed. The material of the resist layers 87, 88 may have resistance to plating, for example, when a plating process is performed in the next step. The material of the resist layers 87, 88 may be, for example, a photosensitive dry film resist or a photoresist liquid. The resist material may be, for example, a novolac resin or an acrylic resin. When using a photosensitive dry film resist, thermocompression bonding is performed to laminate the lower surface of the seed layer 85 and the upper surface of the seed layer 86 with dry films, and a photolithography process is performed to pattern the dry films and form the resist layers 87, 88. When using a photoresist liquid, similar steps are performed to form the resist layers 87, 88.

In the step of FIG. 10B, electrolytic plating (here, electrolytic copper plating) is performed on the lower surface of the seed layer 85 using the resist layer 87 as a plating mask and the seed layer 85 as a plating power feeding layer. Consequently, electrolytic plating metal layers 89, 90 are formed on the lower surface of the seed layer 85 that is exposed from the opening patterns 87X in the resist layer 87. The through holes 41X are entirely filled with the metal layer 89. The metal layer 90 is formed on the lower surface of the metal layer 89 and the lower surface of the seed layer 85.

In the same manner, in the step of FIG. 10B, electrolytic plating (here, electrolytic copper plating) is performed on the upper surface of the seed layer 86 using the resist layer 88 as a plating mask and the seed layer 86 as a plating power feeding layer. Consequently, electrolytic plating metal layers 91 to 94 are formed on the upper surface of the seed layer 86 exposed from the opening patterns 88X, 88Y, 88Z in the resist layer 88. The through holes 51X are entirely filled with the metal layer 91. The through holes 51Y are partially filled with the metal layer 92. The through holes 51Z are partially filled with the metal layer 93. The metal layer 94 is formed on the upper surface of the metal layer 91 and the upper surface of the seed layer 86.

The through holes 51Y, which are located in the region B1, and the through holes 51Z, which are located in the region B2, each have a larger volume than each through hole 51X. Thus, while the through holes 51X are completely filled with the metal layer 91, the through holes 51Y, 51Z are not completely filled with the plating film (metal layers 92, 93). Consequently, the recesses 61X are defined by the upper surface of the metal layer 92, and the recesses 66X are defined by the upper surface of the metal layer 93. The recesses 61X, 66X each include a curved side wall and a curved bottom wall. In other words, the volume of the through holes 51Y, 51Z is set so that the recesses 61X, 66X each include the curved side wall and the curved bottom wall.

Each recess 61X has the same planar shape as the corresponding through hole 51Y and is slightly smaller than the through hole 51Y in a plan view. In the same manner as the through holes 51Y, the whole image of the recesses 61X shapes a particular shape in a plan view. In the present example, the seven-segment numeral "4" is shaped. Also, each recess 66X has the same planar shape as the corresponding through hole 51Z and is slightly smaller than the through hole 51Z in a plan view. In the same manner as the through holes 51Z, the whole image of the recesses 66X shapes a particular shape in a plan view. In the present example, the seven-segment symbol "☐" is shaped.

In the step of FIG. 11A, the resist layers 87, 88, which are illustrated in FIG. 10B, are removed, for example, by an alkaline defoliation liquid. In the step of FIG. 11B, etching is performed using the metal layers 89, 90 as etching masks to remove unnecessary portions of the seed layer 85. Consequently, the seed layer 85 and the metal layer 90 form the wiring layer 42. In the same manner, etching is performed using the metal layers 91 to 94 as etching masks to remove unnecessary portions of the seed layer 86. Consequently, the seed layer 86 and the metal layer 91 form the via wirings 54 in the through holes 51X, and the seed layer 86 and the metal layer 94 form the wiring layer 52 on the insulation layer 51.

Additionally, the seed layer 86 and the metal layer 92 form the via wirings 61 in the through holes 51Y. The seed layer 86 and the metal layer 94 form the conductive pattern 62 on the insulation layer 51. The via wirings 61 and the conductive pattern 62 are located in the region B1. Additionally, the seed layer 86 and the metal layer 93 form the via wirings 66 in the through holes 51Z, and the seed layer 86 and the metal layer 94 form the conductive pattern 67 on the insulation layer 51. The via wirings 66 and the conductive pattern 67 are located in the region B2.

In the step of patterning (lithographic exposure) the resist layers 87, 88 (refer to FIG. 10A), a step-and-repeat exposure process is used. In the step-and-repeat exposure process, for example, a larger substrate body 30 is divided into multiple regions, and each region is exposed to light by a stepper. In such an exposure process, as illustrated in FIGS. 12A and 12B, the substrate body 30 is divided into multiple regions. In the present example, the substrate body 30 is divided into three regions, namely, a region A4 indicated by the bold frame in FIG. 12A, a region A4 indicated by the bold frame in FIG. 12B, and the remaining region A4. The three regions A4 are sequentially exposed to light one by one. That is, the region A4 indicated by the bold frame in FIG. 12A is first exposed to light, and then the region 4A indicated by the bold frame in FIG. 12B is exposed to light. Then, the remaining region A4 is exposed to light. In this case, the same exposure mask is used to expose the three regions A4 to light. Thus, in each region A4, the resist layers 87, 88 (refer to FIG. 10A) are patterned in the same manner. In other words, when the exposure process is performed on the three regions A4 using the stepper, the same opening patterns 87X, 88X, 88Y, 88Z (refer to FIG. 10A) are simply formed. This simply forms the wiring layers 42, 52 having the same patterns (refer to FIG. 11B). Hence, when the exposure process is performed using the stepper, it is difficult to form identification marks that differ in shape from one substrate formation region A2 to another. Also, it is difficult to form identification marks that differ in shape from one frame formation region A3 to another in the regions A4. In this regard, a different exposure mask would be used for each substrate formation region A2 so that the substrate formation regions A2 have identification marks that differ in shape from one another. However, in this case, the light exposure needs to be performed on each substrate formation region A2. Additionally, the exposure mask needs to be replaced for each light exposure. This largely increases the manufacturing cost of the wiring substrate 10.

In this regard, in the present embodiment, as illustrated in FIGS. 8A to 11B, in addition to the patterning of the resist layer 88, the through holes 51Y, 51Z are formed in the step of forming the through holes 51X. Additionally, in the present embodiment, the via wirings 61, 66 and the conductive patterns 62, 67 are formed in the step of forming the via wirings 54 and the wiring layer 52. In the present embodiment, the through holes 51Y, 51Z are formed through laser cutting. This allows for easy formation of the through holes 51Y and the via wirings 61 that differ in planar shape from one substrate formation region A2 to another and the through holes 51Z and the via wirings 66 that differ in planar shape from one frame formation region A3 to another in the regions A4. Further, in the present embodiment, the volume of each of the through holes 51Y, 51Z is adjusted relative to the volume of each through hole 51X. Thus, the via wirings 61, 66 that include the recesses 61X, 66X are formed at the same time when the via wirings 54 are formed. In the present embodiment, the conductive pattern 62 extends throughout the region B1, and the conductive pattern 67 extends throughout the region B2. This eliminates the need for changing the shape of the opening patterns 88Y, 88Z, which corresponds to the shape of the conductive patterns 62, 67, for each substrate formation region A2 and each frame formation region A3. Thus, the shape of the opening pattern 88Y is set to be the same in the substrate formation regions A2, and the shape of the opening pattern 88Z is set to be the same in the frame formation regions A3.

Formation of the through holes 51Y, 51Z, which would increase the manufacturing time (laser cutting time), is performed in the step of forming the through holes 51X. This favorably limits increases in the manufacturing time of the wiring substrate 10. More specifically, increases in the manufacturing time of the wiring substrate 10 is favorably limited as compared to when a different exposure mask is used for each substrate formation region A2, and a different exposure mask is used for each frame formation region A3 in the regions A4. This favorably limits increases in the manufacturing cost of the wiring substrate 10 caused by the formation of the identification marks 15, 25.

In the step of FIG. 13A, the solder resist layer 43, which includes the openings 43X that expose the wiring layer 42 at predetermined portions as the external connection pads P1, is formed on the lower surface of the insulation layer 41. Also, the solder resist layer 53, which includes the openings 53X that expose the wiring layer 52 at predetermined portions as the connection pads P2, is formed on the upper surface 51A of the insulation layer 51. The solder resist layer 53 fills the recesses 61X, 66X of the via wirings 61, 66 and covers the entire surfaces of the conductive patterns 62, 67. The thickness of the solder resist layer 53 is greater at positions that overlap with the recesses 61X, 66X in a plan view than at the remaining position. Formation of the solder resist layer 53 forms the identification mark 15, which is formed by the via wirings 61, the conductive pattern 62, the recesses 61X, and the solder resist layer 53, and the identification mark 25, which is formed by the via wirings 66, the conductive pattern 67, the recesses 66X, and the solder resist layer 53.

The above manufacturing steps manufacture the wiring substrate 10. More specifically, the wiring substrate 12 is manufactured in each substrate formation region A2, and the frame 20 is manufactured in each frame formation region A3.

The wiring substrate 10 illustrated in FIG. 13A is cut by a dicing blade or the like along the cutting positions A1. As a result, the wiring substrate 10 is singulated into the wiring substrates 12, one of which is illustrated in FIG. 13B. This manufactures the wiring substrates 12. The frame 20 (refer to FIG. 13A) is discarded after the wiring substrate 10 is cut.

The present embodiment has the advantages described below.

(1) The identification mark 15 is formed by the via wirings 61, which are formed in the through holes 51Y, the conductive pattern 62, which connects the via wirings 61, the recesses 61X, which are defined by the upper surfaces of the via wirings 61, and the solder resist layer 53, which fills the recesses 61X and covers the via wirings 61 and the conductive pattern 62. Each recess 61X includes the curved side wall. This increases the contrast between the upper surface 62A of the conductive pattern 62 and the upper surfaces of the via wirings 61 and improves the recognizability of the identification mark 15, which is shaped by the recesses 61X defined by the upper surfaces of the via wirings 61.

(2) The thickness of the solder resist layer 53 is greater over the via wirings 61 than over the conductive pattern 62. This increases the contrast of the solder resist layer 53 between a portion located on the via wirings 61 and a portion located on the conductive pattern 62. Consequently, the recognizability of the identification mark 15 is further improved.

(3) In addition to the patterning of the resist layer 88 (formation of wiring layer 52), the through holes 51Y, 51Z are formed in the insulation layer 51. The via wirings 61, 66, which include the recesses 61X, 66X, are formed in the through holes 51Y, 51Z, respectively. The through holes 51Y, 51Z are formed through laser cutting. This allows for easy formation of the identification marks 15 that differ in shape from one substrate formation region A2 to another and the identification marks 25 that differ in shape from one frame formation region A3 to another in the regions A4. In other words, the identification marks 15, 25 may be located in any position and have any shape. This increases the degree of freedom for designing the identification mark 15 formed on each wiring substrate unit 12 and the identification mark 25 formed on each frame 20.

(4) The conductive pattern 62 extends throughout the region B1. The conductive pattern 67 extends throughout the region B2. This eliminates the need for changing the shape of the opening patterns 88Y, 88Z, which correspond to the shape of the conductive patterns 62, 67, for each substrate formation region A2 and each frame formation region A3 and allows the same shape to be set in the substrate formation regions A2 and in the frame formation regions A3. Thus, the light exposure process using the stepper may be used to form the conductive pattern 62 in each substrate formation region A2 and the conductive pattern 67 in each frame formation region A3.

(5) In the step of forming the through holes 51X, the through holes 51Y, 51Z are formed through laser cutting. This limits increases in the manufacturing time of the wiring substrate 10 and favorably limits increases in the manufacturing cost of the wiring substrate 10.

(6) The through holes 51X, 51Y, 51Z are formed so that each of the through holes 51Y, 51Z have a larger volume than each through hole 51X. Thus, the via wirings 61, 66 that include the recesses 61X, 66X are formed at the same time when the via wirings 54 are formed. This favorably limits increases in the manufacturing time of the wiring substrate 10 caused by the formation of the identification marks 15, 25 and favorably limits increases in the manufacturing cost of the wiring substrate 10.

It should be apparent to those skilled in the art that the foregoing embodiments may be employed in many other specific forms without departing from the scope of this disclosure. Particularly, it should be understood that the foregoing embodiments may be employed in the following forms.

In the above embodiment, the recesses 61X, 66X are each semicircular in a cross-sectional view. More specifically, the side wall and the bottom wall of each of the recesses 61X, 66X are curved. Instead, the bottom wall of each of the recesses 61X, 66X may be flat. More specifically, as long as the side wall of each of the recesses 61X, 66X is curved, the bottom wall may have any shape.

In the wiring substrate 10 of the above embodiment, the recesses 61X, 66X may be filled with an insulation layer (protective insulation layer) other than the solder resist layer, and the insulation layer may be formed on the insulation layer 51.

The wiring pattern 50B may be omitted from the above embodiment.

The wiring pattern 50C may be omitted from the above embodiment.

Figure 14A:
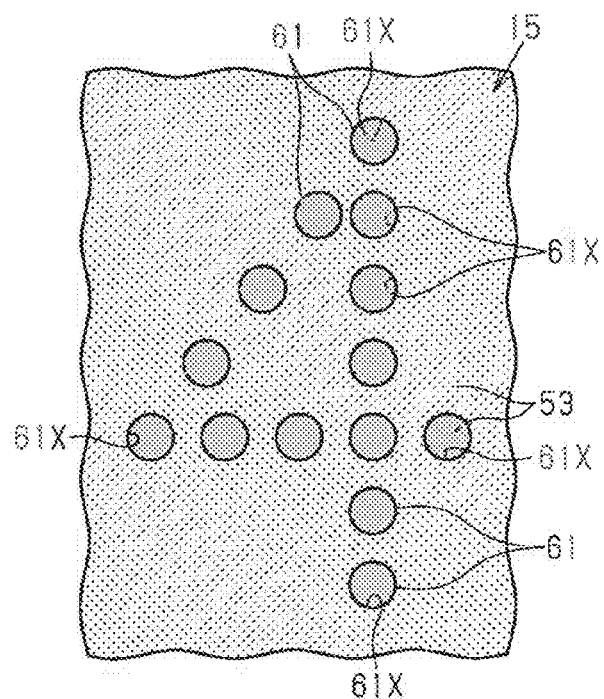
FIGS. 14A and 14B are schematic plan views illustrating modified examples of identification marks.
Figure 14B:
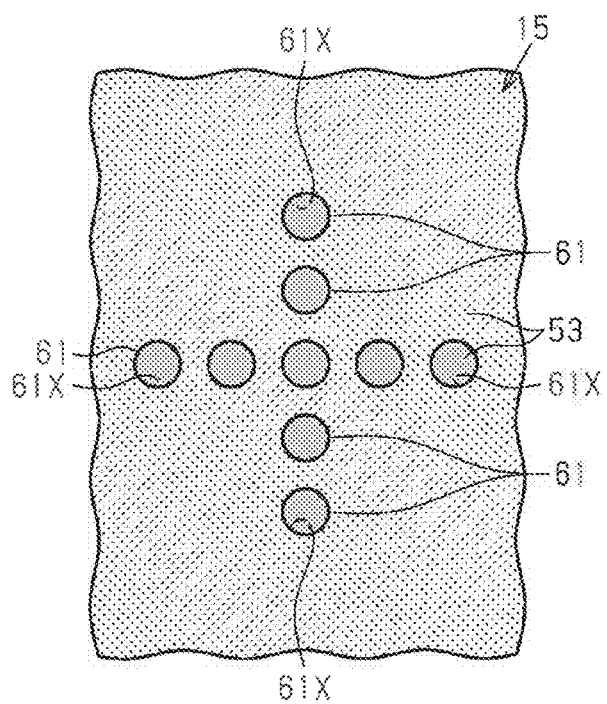

In the above embodiment, the identification mark 15 has a planar shape that is identified as a seven-segment numeral. Instead, the planar shape may be identified as a particular character or symbol other than a seven-segment numeral. For example, as illustrated in FIG. 14A, the recesses 61X may be arranged to shape an Arabic numeral "4". Alternatively, as illustrated in FIG. 14B, the recesses 61X may be arranged to shape, for example, a symbol of "+". That is, the recesses 61X only need to be arranged to be identifiable as a particular shape as a whole image in a plan view. The identification mark 25 may be modified in the same manner as the identification mark 15.

In the above embodiment, each of the recesses 61X and 66X forms a particular shape (e.g., numeral "4" or symbol "□" obtained by the seven-segment display).

Figure 15A:
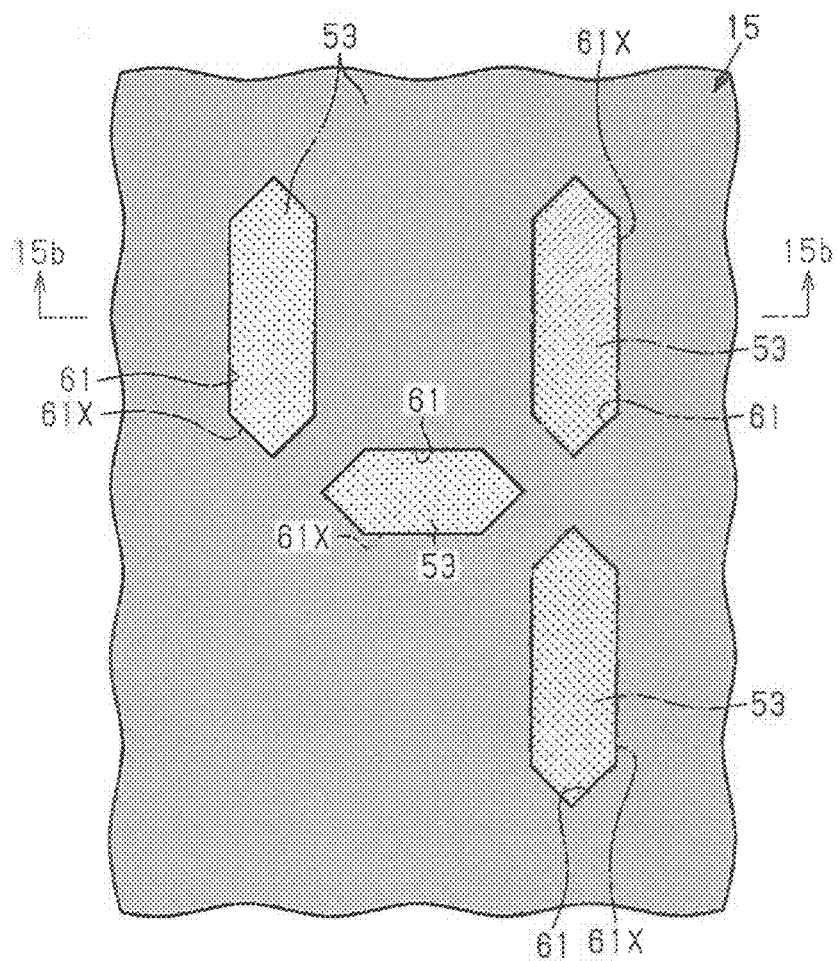
FIG. 15A is a schematic plan view illustrating another modified example of an identification mark.
Figure 15B:
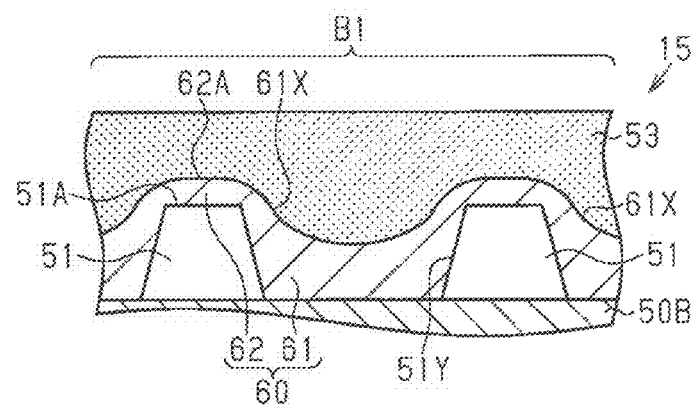
FIG. 15B is a schematic cross-sectional view of the identification mark illustrated in FIG. 15A taken along line 15b-15b in FIG. 15A.
Figure 16:
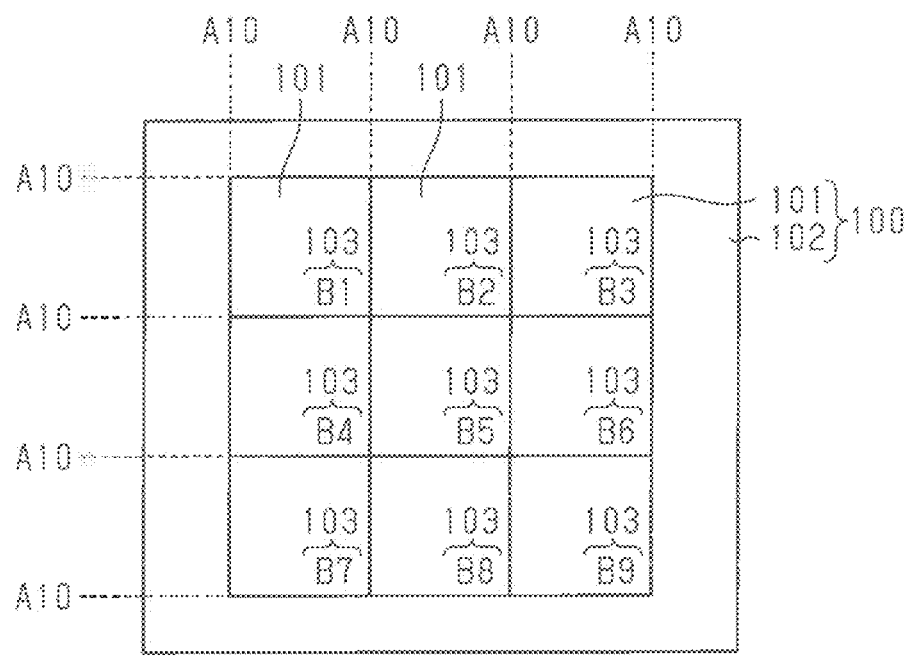
FIG. 16 is a schematic plan view of a related art wiring substrate.

Instead, as illustrated in FIG. 15A, the recesses 61X may be formed, for example, to surround the contour of a particular shape (here, seven-segment numeral "4"). In this case, as illustrated in FIG. 15B, the conductive pattern 62 that is edged with the recess 61X forms a particular shape (here, seven-segment numeral "4") in a plan view. Thus, the solder resist layer 53 that is formed on the upper surface 62A of the conductive pattern 62 is identified as the particular shape. In this modified example, the thickness of the solder resist layer 53 is smaller over the conductive pattern 62 than over the via wirings 61. The identification mark 25 may be modified in the same manner as the identification mark 15.

In the wiring substrate 10 of the above embodiment, the light exposure may be performed using the stepper to form an identification mark in addition to the identification marks 15, 25, which are shaped by the through holes 51Y, 51Z and the recesses 61X, 66X.

In the above embodiment, the identification marks 15, 25 are formed on a surface where a chip is mounted (connection pads P2 are formed). Instead, the identification marks 15, 25 may be formed on a surface where external connection terminals are located (external connection pads P1 are formed).

The identification mark 25 may be omitted from the above embodiment.

In the wiring substrate 12 of the above embodiment, any number of the wiring layers 40, 50, 42, 52 and the insulation layers 41, 51 may be used. Also, the wiring layers 40, 50, 42, 52 and the insulation layers 41, 51 may have any shape and any layout pattern.

In the above embodiment, the semiconductor chip 71 is mounted on the wiring substrate 12. However, any element may be mounted on the wiring substrate 12. The above embodiment and modified examples of the wiring substrate 12 may be applied to, for example, a package-on-package, which has a structure in which another wiring substrate is formed on the wiring substrate 12.

In the above embodiment, any number of semiconductor chips may be mounted on the wiring substrate 12. Also, any mode for mounting the semiconductor chip (e.g., flip-chip mounting, wire-bonding mounting, or combination of them) may be used.

In the above embodiment, the wiring substrate 10 includes the three blocks 11. However, any number of blocks 11 may be used. The wiring substrate 10 may include, for example, one, two, or four or more of blocks 11.

In the above embodiment, each block 11 in the wiring substrate 10 includes the wiring substrate units 12 arranged in a matrix. The wiring substrate units 12 may be arranged in a strip-shaped manner. More specifically, as long as each block 11 includes the wiring substrate units 12 that are laid out in an N×M arrangement (N is an integer of two or greater, M is an integer of one or greater), the wiring substrate units 12 may have any arrangement.

Clauses

This disclosure encompasses the following embodiments.

1. A method for manufacturing a wiring substrate, the method including:

forming an insulation layer;

forming first through holes that extend through the insulation layer in a thickness-wise direction to form a particular shape including a character or a symbol;

forming first via wirings in the first through holes, wherein each of the first via wirings includes an upper surface that defines a recess having a planar shape corresponding to one of the first through holes;

forming a conductive pattern on an upper surface of the insulation layer, wherein the conductive pattern and the first via wirings are formed from the same material, and the conductive pattern is connected to the first via wirings; and forming a protective insulation layer on the upper surface of the insulation layer, wherein the protective insulation layer covers the conductive pattern and the first via wirings, wherein the recesses in the first via wirings are filled with the protective insulation layer, the first via wirings, the conductive pattern, the recesses, and the protective insulation layer form an identification mark that is identifiable as the particular shape, each recess includes a bottom wall that is located at a position that is lower than an upper surface of the conductive pattern, each recess further includes a curved side wall, and the protective insulation layer is greater in thickness over each of the first via wirings than over the conductive pattern.

2. A method for manufacturing a wiring substrate, the method including:

forming an insulation layer that covers a first wiring pattern and a second wiring pattern;

forming first through holes that extend through the insulation layer in a thickness-wise direction and partially expose an upper surface of the first wiring pattern to form a particular shape including a character or a symbol;

forming a second through hole that extends through the insulation layer in the thickness-wise direction and partially exposes an upper surface of the second wiring pattern;

forming first via wirings in the first through holes, wherein each of the first via wirings includes an upper surface that defines a recess having a planar shape corresponding to one of the first through holes;

forming a conductive pattern on an upper surface of the insulation layer, wherein the conductive pattern and the first via wirings are formed from the same material, and the conductive pattern is connected to the first via wirings;

forming a second via wiring, with which the second through hole is filled;

forming a wiring layer on the upper surface of the insulation layer, wherein the wiring layer is electrically connected to the second wiring pattern by the second via wiring; and forming a protective insulation layer on the upper surface of the insulation layer, wherein the protective insulation layer covers the conductive pattern and the first via wirings, wherein the recesses in the first via wirings are filled with the protective insulation layer, the protective insulation layer includes an opening that exposes at least a portion of the wiring layer as a connection pad, the first via wirings, the conductive pattern, the recesses, and the protective insulation layer form an identification mark that is identifiable as the particular shape, the first through holes and the second through hole are formed through laser cutting, each of the first through holes has a larger volume than the second through hole, each recess includes a bottom wall that is located at a position that is lower than the upper surface of the insulation layer, each recess further includes a curved side wall, and the protective insulation layer is greater in thickness over each of the first via wirings than over the conductive pattern.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
   an insulation layer;
   first through holes that extend through the insulation layer in a thickness-wise direction and form a particular shape including a character or a symbol;
   first via wirings formed in the first through holes;
   a conductive pattern formed on an upper surface of the insulation layer and connected to the first via wirings, wherein the conductive pattern and the first via wirings are formed from the same material;
   recesses formed in the first via wirings, wherein each of the recesses is defined by an upper surface of the corresponding first via wiring and includes a bottom wall that is located at a position that is lower than an upper surface of the conductive pattern; and
   a protective insulation layer formed on the upper surface of the insulation layer to cover the conductive pattern and the first via wirings, wherein the recesses are filled with the protective insulation layer, wherein
   the first via wirings, the conductive pattern, the recesses, and the protective insulation layer form an identification mark that is identifiable as the particular shape,
   each of the recesses includes a curved side wall, and
   the protective insulation layer is greater in thickness over the first via wirings than over the conductive pattern.

2. The wiring substrate according to claim 1, wherein the bottom wall of each of the recesses is located at a position that is lower than the upper surface of the insulation layer.

3. The wiring substrate according to claim 1, wherein the conductive pattern is formed throughout a region where the identification mark is formed.

4. The wiring substrate according to claim 1, wherein each of the first through holes is tapered to have a width that decreases from the upper surface of the insulation layer toward a lower surface of the insulation layer.

5. The wiring substrate according to claim 1, wherein the protective insulation layer is a solder resist layer.

6. The wiring substrate according to claim 1, wherein the particular shape is obtained by a seven-segment character or a seven-segment symbol.

7. The wiring substrate according to claim 1, further comprising:
   a first wiring pattern and a second wiring pattern that are formed on a lower surface of the insulation layer, wherein the first through holes extend through the insulation layer in the thickness-wise direction to partially expose an upper surface of the first wiring pattern;
   a second through hole that extends through the insulation layer in the thickness-wise direction to partially expose an upper surface of the second wiring pattern;
   a second via wiring with which the second through hole is filled; and
   a wiring layer formed on the upper surface of the insulation layer and electrically connected to the second wiring pattern by the second via wiring, wherein
   the protective insulation layer includes an opening that exposes at least a portion of the wiring layer as a connection pad, and
   each of the first through holes has a larger volume than the second through hole.

8. A semiconductor device comprising:
   a wiring substrate according to claim 7; and
   a semiconductor chip electrically connected to the connection pad and mounted on the wiring substrate.

* * * * *